(12) United States Patent
Hada et al.

(10) Patent No.: US 6,718,630 B2
(45) Date of Patent: Apr. 13, 2004

(54) APPARATUS AND METHOD FOR MOUNTING COMPONENTS ON SUBSTRATE

(75) Inventors: Junichi Hada, Yamanashi-ken (JP); Shozo Fukuda, Yamanashi-ken (JP); Shigeki Imafuku, Yamanashi-ken (JP); Akira Noudo, Yamanashi-ken (JP); Yoshiyuki Hattori, Kofu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/953,180

(22) Filed: Sep. 17, 2001

(65) Prior Publication Data

US 2002/0069525 A1 Jun. 13, 2002

(30) Foreign Application Priority Data

Sep. 18, 2000 (JP) .................................. 2000-282440
Sep. 26, 2000 (JP) .................................. 2000-292148

(51) Int. Cl.[7] ............................................... H05K 3/30
(52) U.S. Cl. ........................ 29/832; 29/740; 29/833; 29/741
(58) Field of Search ........................ 29/832, 740, 743, 29/741

(56) References Cited

U.S. PATENT DOCUMENTS

| 4,706,187 A | * | 11/1987 | Arai et al |
|---|---|---|---|
| 4,805,110 A | * | 2/1989 | Takahashi et al. |
| 5,070,589 A | * | 12/1991 | Itagaki et al. |
| 5,339,248 A | * | 8/1994 | Fajiwara et al. |
| 5,377,405 A | * | 1/1995 | Sakurai et al. |
| 5,501,005 A | * | 3/1996 | Onitsuka |
| 5,671,527 A | * | 9/1997 | Asai et al. |

FOREIGN PATENT DOCUMENTS

EP          0 891 129          1/1999

* cited by examiner

Primary Examiner—Carl J. Arbes
(74) Attorney, Agent, or Firm—Wenderoth, Lind & Ponack, L.L.P.

(57) ABSTRACT

An apparatus has a holder that receives a component from a component supply and then places the component on a substrate. In operation, it is determined whether the holder would make an interference with another component already mounted on the substrate. If this judgement is affirmative, mounting of the component held by the holder is prohibited. If, on the other hand, this judgement is negative, the component held by the holder is mounted onto the substrate.

8 Claims, 29 Drawing Sheets

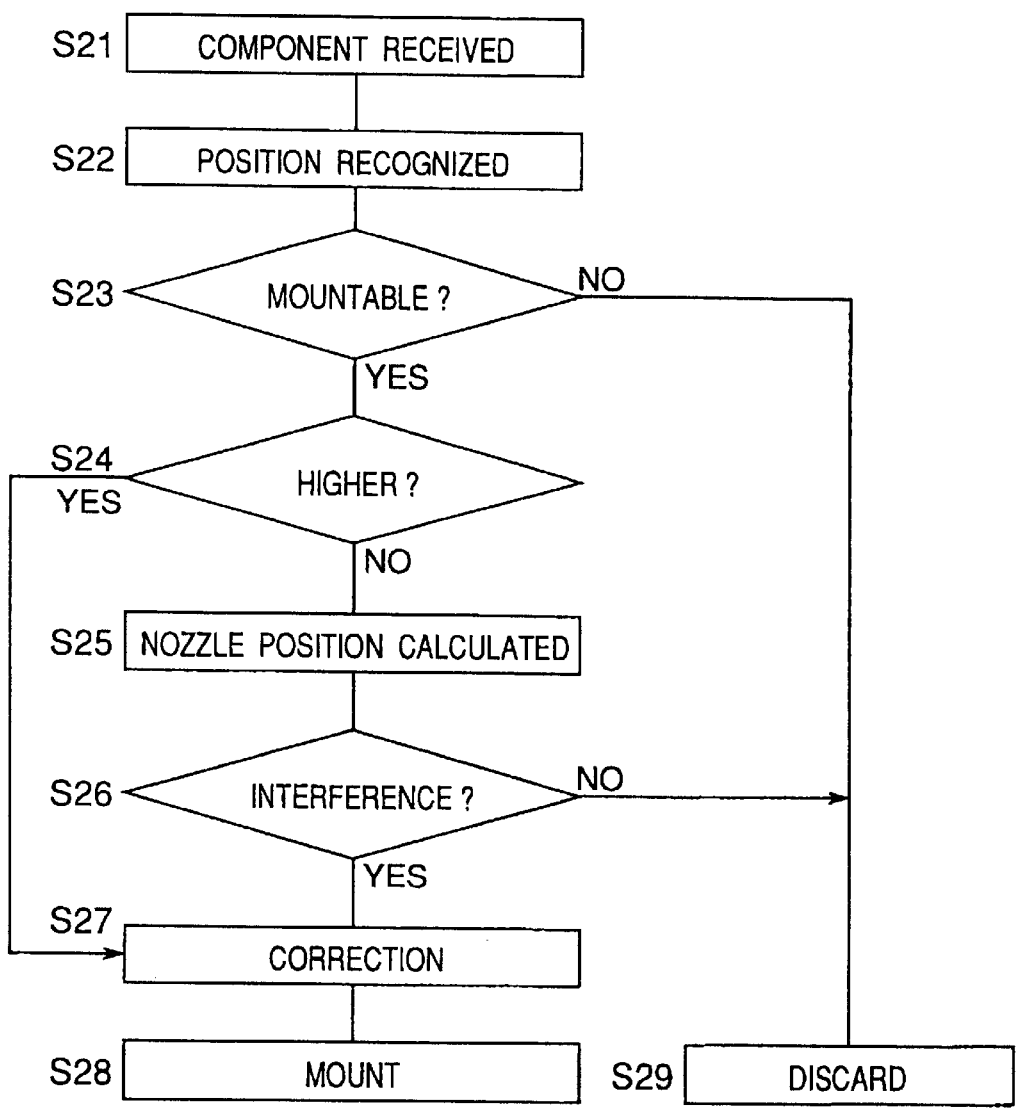

INTERFERENCE

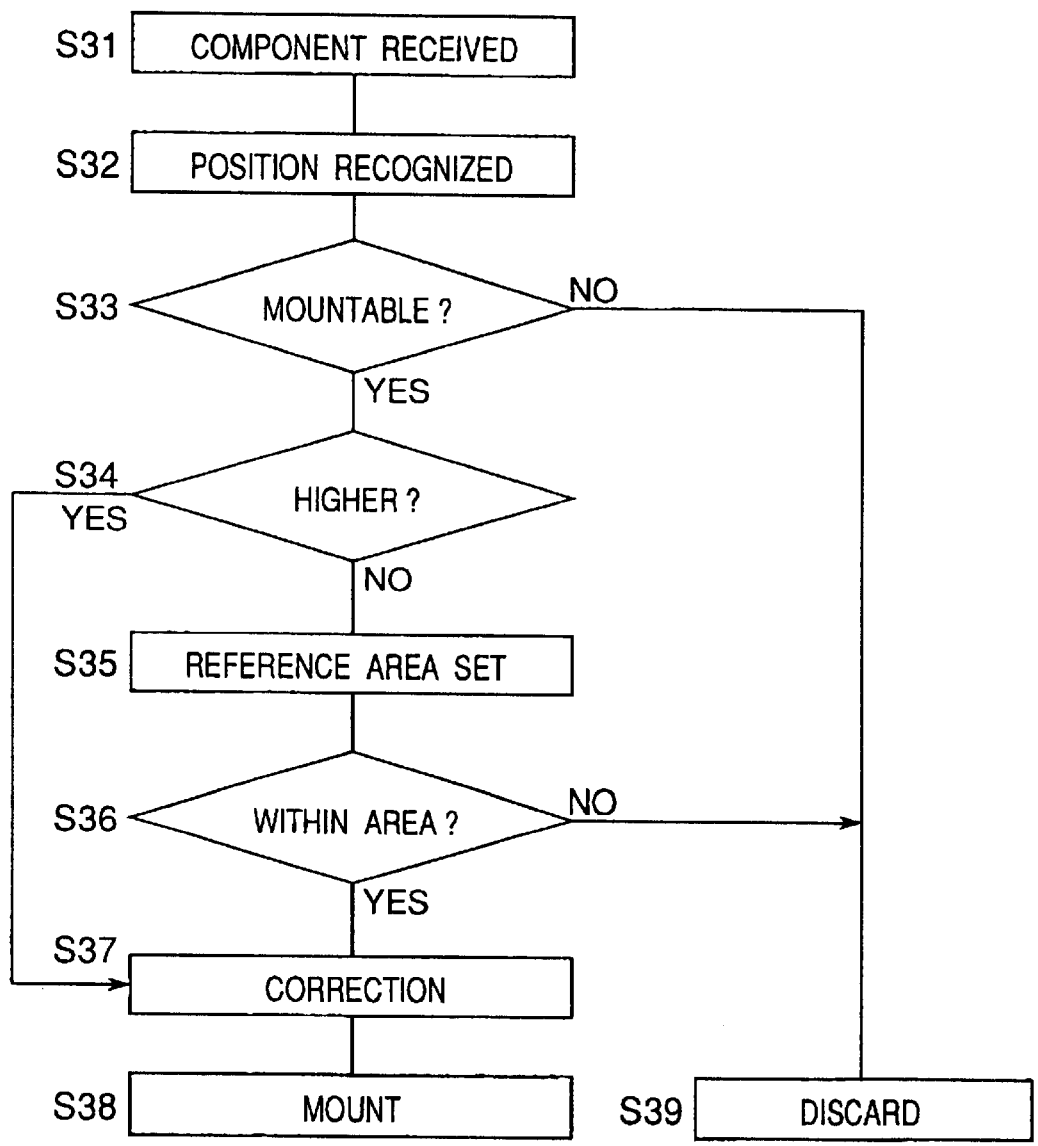

| BLOCK | X | Y | Z | ... |
|---|---|---|---|---|
| 1 | 0.00 | 0.00 | 1 | |
| 2 | -5.00 | 0.00 | 1 | |
| 3 | -10.00 | 0.00 | 2 | |
| 4 | -10.00 | -10.00 | 3 | |
| 5 | -10.00 | -15.00 | 4 | |
| ⋮ | | | | |

| Z | COMPONENT CODE | ... |
|---|---|---|
| 1 | 1608R | |
| 2 | 2125C | |
| 3 | 1608R | |
| 4 | 1608R | |
| 5 | AL-3P | |
| ⋮ | | |

| SHAPE | FEATCENE | | OPERATION | | SUPPLY | | NEIGHBOR | |
|---|---|---|---|---|---|---|---|---|
| | | ... | HEAD SPEED | ... | SUPPLY METHOD | ... | NOZZLE SHAPE | LIMIT |
| 0608R | 1.6×0.8 | | 1 | | PAPER 6mm | | 1.8×1.0 | 0.2mm |
| 2125C | 2.0×1.25 | | 1 | | PAPER 6mm | | 2.0×1.8 | 0.3mm |
| AL-3P | 3.2×2.0 | | 3 | | EMBOSS 8mm | | 3.0×2.0 | 0.0mm |
| | | | | | | | | |

FIG. 27
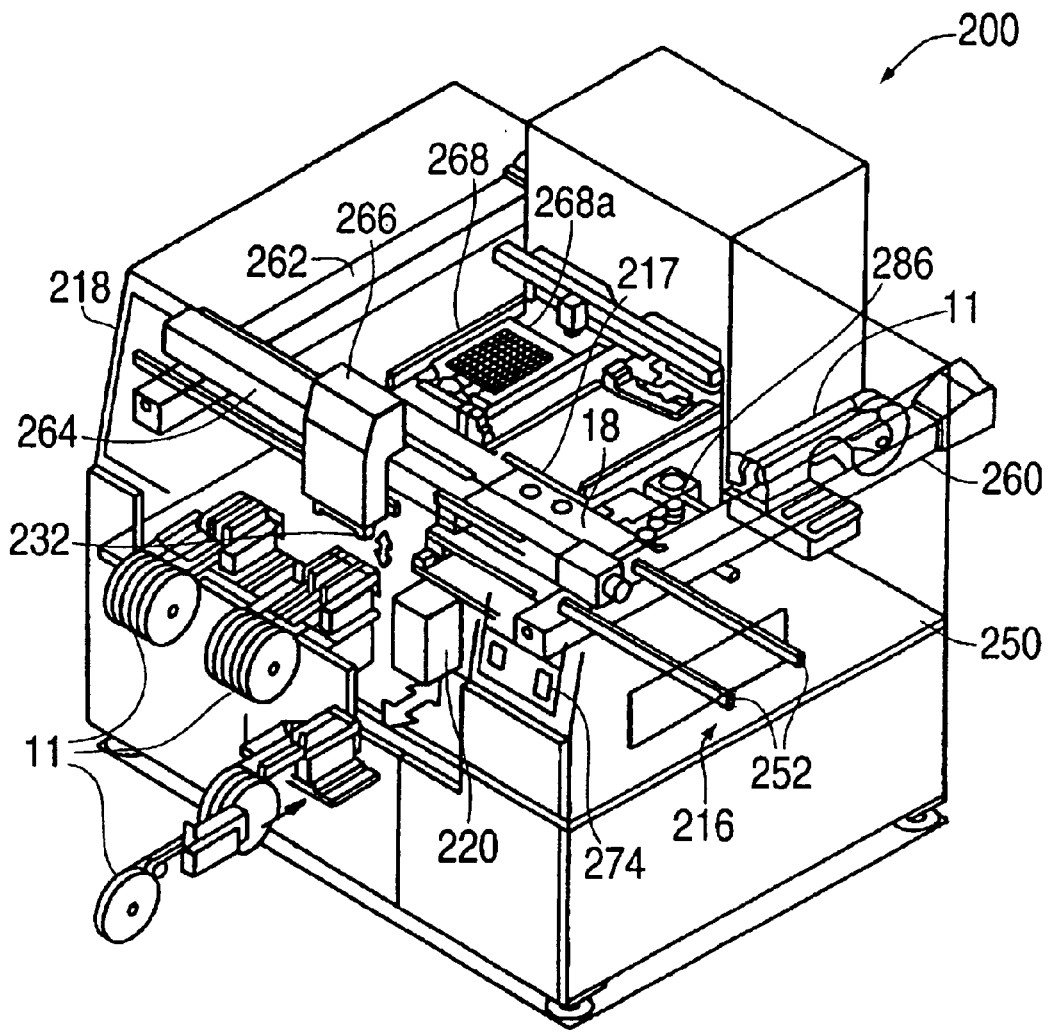
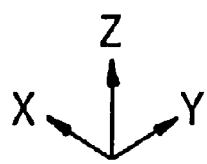

APPARATUS AND METHOD FOR MOUNTING COMPONENTS ON SUBSTRATE

FIELD OF THE INVENTION

The present invention relates to an apparatus and method for mounting electric components on a substrate such as a circuit board.

BACKGROUND OF THE INVENTION

Referring to FIG. 31, there is illustrated a conventional mounting system generally indicated by reference numeral 1. In general, the system 1 includes a supply section 2 for supplying electric components, a placement head 3 for receiving a component from the supply section 2 and then mounting the component on a substrate such as a circuit board, a transport unit 4 for transporting the placement head 3, a recognition device 5 for taking a digital image of the component held by the placement head 3, a holding section 6 for receiving and holding the substrate onto which components are mounted, and a controller 7 for controlling an entire operation of the system 1.

In operation of the system 1, the placement head 3 moves to a predetermined position above the supply section 2 bearing a component supply cassette 11, for example, with a number of components 12. A vertically extending vacuum nozzle 13 in the form of a quill supported by the placement head 3 is moved down to receive a component 12. The placement head 3 is then rotated about a vertical axis, i.e. Z-axis, by an angle controller 14 so that the component is oriented in a predetermined direction. The recognition device 5 takes an image of the component 12, supported by the nozzle 13 of the placement head 3, moving past a predetermined position opposing the recognition device 5. The image is transmitted to an image processor 20 where the image is processed according to a specific image processing technique to determine a position of the component, i.e., its horizontal and/or angular displacement relative to the nozzle. Information indicating the position of the component is transmitted to the controller 7. Based upon the information, the controller 7 corrects the position of the component. Then, the nozzle 13 is moved above a predetermined placement position of substrate 18 and then down toward the substrate 18 so that the component 12 is mounted on the substrate.

FIG. 32 is a flowchart showing a conventional method for mounting components. In this method, at step S1101, nozzle 13 receives component 12. Then, at step S1102, recognition device 5 takes a picture of the component 12 held by the nozzle 13. The picture is processed at image processor 20. A position of the component 12 is determined at step S1103 so as to determine whether the component 12 can be mounted on substrate 18. If the component 12 is incapable of being mounted on the substrate, the nozzle 13 brings the component to a collect station (not shown) at step S1106. Otherwise, horizontal and/or angular displacement of the nozzle 13 is determined at step S1104. Using this determined displacement, a horizontal position of the placement head 3 and/or an angular orientation of the nozzle 13 is adjusted. Finally, the component 12 is mounted in position onto the substrate 18 at step S1105. During this process, no judgement is made as to whether the nozzle 13 interferes with one or more components already mounted on the substrate 18.

In the meantime, electric devices are likely to be small sized and light-weight, thereby increasing a density of components mounted on substrate 18 considerably. For example, a clearance between neighboring components of about 1.0 mm×0.5 mm is decreased to about 0.2 mm. Notwithstanding this, each component should be mounted on the substrate so that it does not interfere with another component already mounted on the substrate. To this end, used is a nozzle with a tip end designed to be larger than a small component 12.

However, where clearance of components is down to about 0.1 mm, for example, a displacement of component 12 relative to nozzle 13 may result in an interference between the nozzle 13 and the component 12 already mounted on the substrate 18. This is illustrated in FIGS. 33A and 34B. In each drawing, illustrated are nozzle 13 and components (12, 12a) both viewed from a substrate. Specifically, in FIG. 33A, the nozzle 13 is shown so that it is angularly inclined relative to the component 12. In this instance, using an image of the component captured by recognition device 5 and a result obtained by image processor 20, controller 7 corrects a horizontal and/or angular position of the component 12 relative to the nozzle 13 before mounting of the component 12 so that the component is placed at a predetermined, correct position on the substrate. However, as shown by hatched lines in FIG. 33B, a part of the nozzle can result in an interference with another component 12a already mounted on the substrate. On the other hand, FIG. 34A shows a nozzle and component retained by the nozzle in which the component is horizontally offset from a center of the nozzle. In this instance, as shown in FIG. 34B, nozzle 13 is displaced so that the component is mounted at a correct position on the substrate, and this in turn results in an interference with another component 12a already mounted on the substrate as shown by hatching.

Although not clearly shown in these plan views, i.e., FIGS. 33B and 34B, since the component has a certain height, interference may be more problematic for a case with a reduced clearance when considering a deviation of height and/or inclination of the component. That is, interference between nozzle 13 and component 12a results in another displacement of the component 12a. What is worse, component 12 may be damaged, which results in a deterioration and/or malfunction of a circuit.

SUMMARY OF THE INVENTION

Therefore, a purpose of the present invention is to provide an apparatus and method for mounting a component on a substrate, which is capable of mounting the component on the substrate without any interference between a nozzle and a component already mounted on the substrate even when only a small clearance is ensured between components on the substrate due to a requirement of compactness of the components.

To this end, according to the apparatus and method of the present invention, a holder receives a component from a component supply and then places the component on a substrate. In operation, a judgement is made as to whether the holder would make an interference with another component already mounted on the substrate. Then, if the judgement is affirmative, a mounting of the component held by the holder is prohibited. If, on the other hand, the judgement is negative, the component held by the holder is mounted on the substrate.

BRIEF DESCRIPTION OF THE DRAWINGS

FIG. 5 is a flowchart showing a method for mounting components on a substrate according to another embodiment of the present invention;

FIG. 7 is a flowchart showing a method for mounting components on a substrate according to another embodiment of the present invention;

FIG. 19 is a table showing an example of an NC program;

FIG. 20 is a table showing an example of an arrangement program;

FIG. 21 is a table showing an example of a parts library;

FIG. 27 is a perspective view of another component mounting apparatus;

FIGS. 33A–34B are schematic plan views for describing interference between a holder and a component.

DETAILED DESCRIPTION OF THE PREFERRED EMBODIMENTS

First Embodiment

Figure 1:
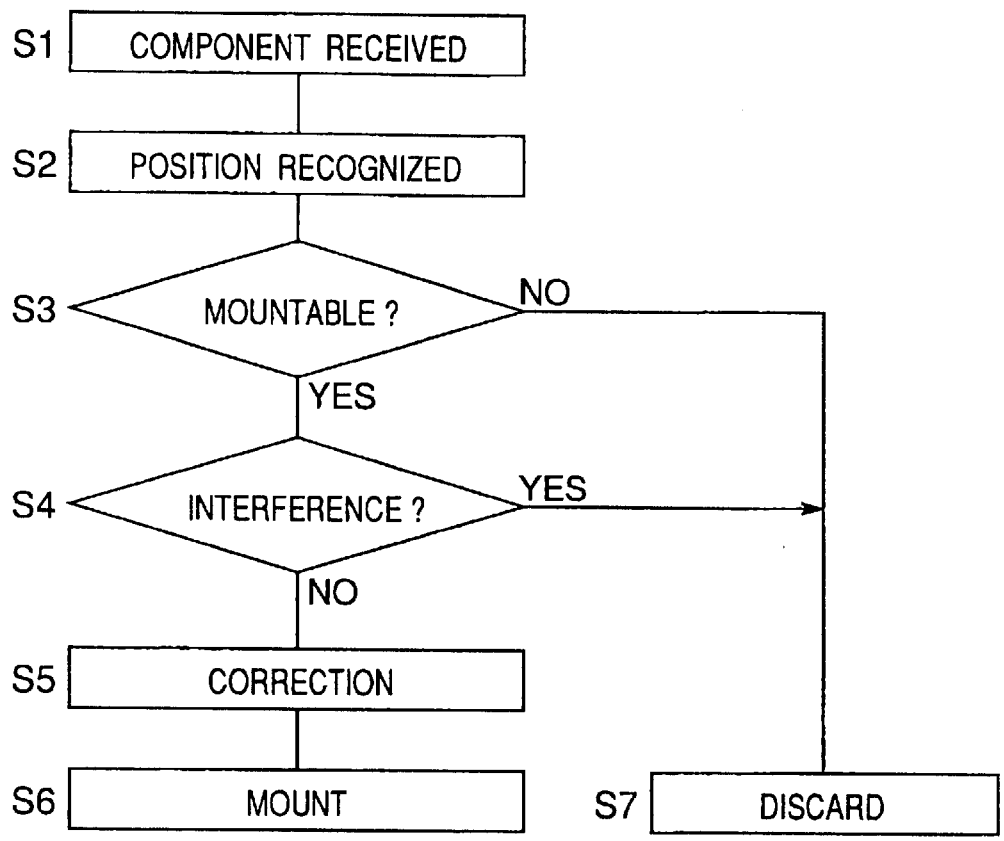
FIG. 1 is a flowchart showing a method for mounting components on a substrate according to a first embodiment of the present invention.

With reference to the drawings, description will be made to a system and method for mounting a component onto a substrate or circuit board according to a first embodiment of the present invention. The system of the present invention has an appearance that is substantially identical to the conventional system illustrated in FIG. 31. Namely, system 1 has a component supply 2, a placement head 3 for receiving and mounting a component, a robot or transport device 4 for transporting the placement head 3, a recognition device 5 for taking a picture of a component held by the placement head, a holder 6 for receiving and then holding a substrate, and a controller 7 for controlling an entire operation of the system.

Generally, the placement head 3 causes its nozzle 13 to receive component 12 from the component supply 2 and, while moving toward the recognition device 5, rotate the nozzle about its vertical axis so that the component orients in a predetermined mounting direction. The recognition device 5 takes a picture of the component held by nozzle 13 of the placement head 3. The picture is then processed by an image processor 20 to determine a position of the component 12 on the nozzle 13. The determined position is transmitted to the controller 7. Based upon an instruction from the controller 7, the placement head 3 corrects, if any, horizontal and/or angular displacement of the component and then places the component in a predetermined area on substrate 18. Typically, the picture of the component is taken while the placement head 3 is moving toward a placement station. However, according to the type of the recognition device 5, the placement head 3 may halt while taking a picture of the component.

FIG. 1 is a flowchart showing a process for mounting a component according to an embodiment of the present invention, which is carried by the controller 7. According to this program, at step S1 component 12 is received by nozzle 13 of the placement head. At step S2 the recognition device 5 picks up an image of the component held by the nozzle. The image is transmitted to and then processed by the image processor 20. Using a result obtained by the image processor 20, it is determined at step S3 whether the component can be mounted on a substrate. If it is determined that the component is incapable of being mounted correctly on the substrate, the program proceeds to step S7, causing the nozzle 13 to discard the component at a collect station (not shown). This occurs where the component is considerably inclined relative to a surface of the substrate; the nozzle bears an incorrect component; or the component is outside a field of the recognition device so that the recognition device is unable to pick up an entire image of the component.

If it is determined at step S3 that the component is in a condition such that it can be mounted on the substrate, the program proceeds to step S4. At this step, another determination is made whether, during mounting of the component, the nozzle 13 would make an interference with a component mounted on the substrate due to horizontal and/or angular adjustment of the component held by the nozzle relative to the nozzle. This determination will be described fully together with the specific embodiments. If, on the other hand, it is determined at step S4 that there exists a possibility of interference between the nozzle 13 and a component 12a mounted on the substrate, the program proceeds to step S7. At this step, the component 12 held by the nozzle 13 is discarded at the collect station (not shown). Indeed, there exists another option in which the nozzle 13 is moved and/or rotated to a certain extent in order to avoid interference during mounting of the component 12, which will be described in detail below. Then, the program proceeds to step S5 where a horizontal and/or angular correction of the nozzle 13 required for mounting of the component 12 is determined. Subsequently, the nozzle 13 is corrected and then the component 12 is mounted on substrate 18 at step S6. After completion of the mounting or discard of the component, the nozzle 13 moves again toward the component supply 2 for a next pickup operation of a component. The above steps are repeated for subsequent components to be mounted on the substrate.

Second Embodiment

Next, referring to the drawings, description will be made to a component mounting apparatus and method according to a second embodiment of the present invention. Basically, structure of appearance and operation of a system of this embodiment is similar to that of the first embodiment described above, except for a process for prevention of interference between a nozzle and a component.

Figure 2:
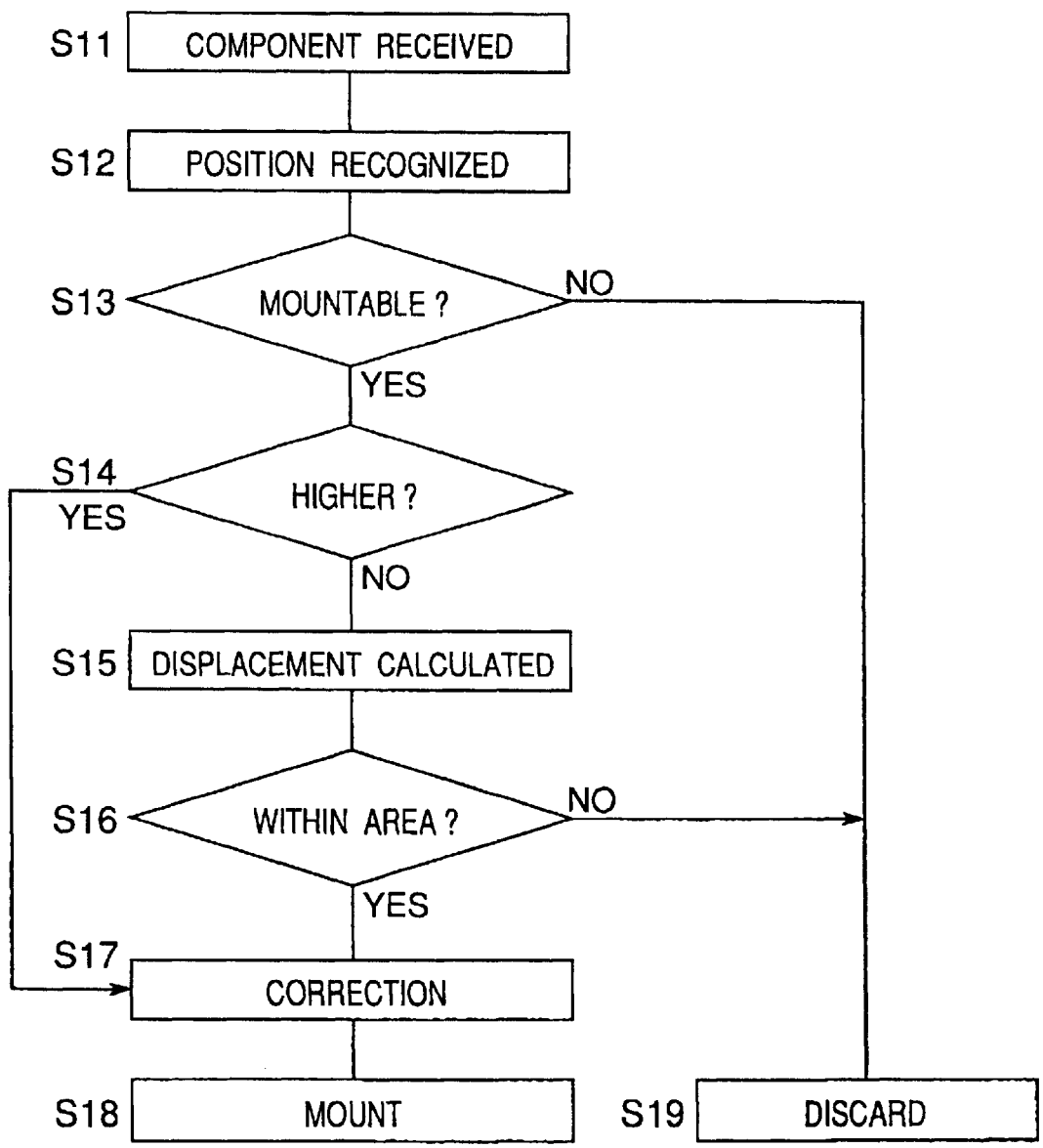
FIG. 2 is a flowchart showing a method for mounting components on a substrate according to another embodiment of the present invention.

Referring to FIG. 2, there is a process performed by controller 7. In this process, component 12 is supported on a nozzle at step S11. Then, a position of the component 12 held by the nozzle is determined at step S12, which is used at step S13 for a determination of whether the component can be mounted on a substrate. If it is determined at step S13 that the component is unable to be mounted on the substrate in a proper way, the program proceeds to step S19 where the component is discarded at a collect station. The operations described above are the same as those described for the first embodiment.

Figure 3:
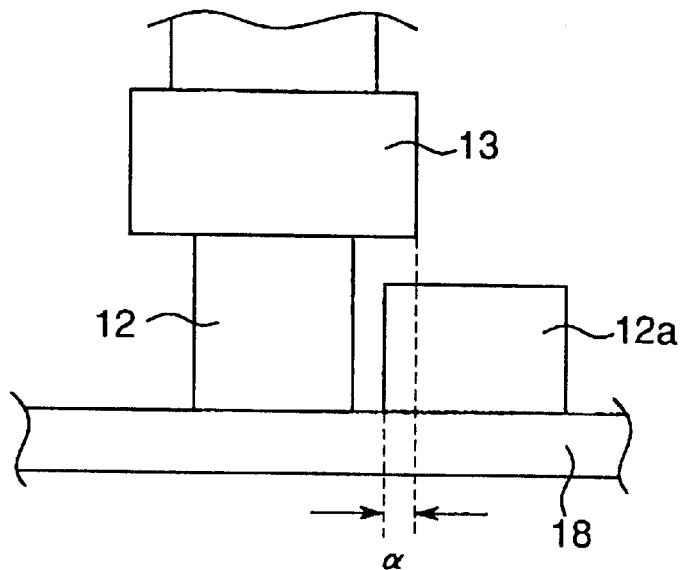
FIG. 3 is an enlarged side elevational view showing heights of components mounted on a substrate.

If, on the other hand, it is determined at step 13 that the component is held so that it can be mounted on the substrate, another determination is made at step S14. At this step, it is determined whether the nozzle 13 makes an interference with component 12a mounted on the substrate during placement of the component 12 held by nozzle 13. For this purpose, a first decision is made as to whether a height of the component 12 held by the nozzle 13 is greater than that of the component 12a around which the component 12 will be mounted. FIG. 3 illustrates a spatial relationship between the component 12 held by the nozzle and the component 12a mounted on the substrate. As shown in the drawing, if the height of the component 12 to be mounted is equal to or greater than that of the mounted component 12a, no physical interference between the nozzle 13 and the mounted component 12a will occur even when the nozzle 13 overlaps the mounted component 12a in a region indicated by α. The heights of the components 12 and 12a are transmitted to and then stored in controller 7 (see FIG. 31). Therefore, in this instance the program proceeds to step S17 where a horizontal and/or angular correction of the nozzle is determined in order to mount the component 12 in a predetermined position on the substrate. Based upon this determination, the component 12 is placed on substrate 18 at step S18.

If, on the other hand, the height of the component 12 is less than that of the mounted component 12a, a calculation is made to determine a relationship between the nozzle 13 and the mounted component 12a, i.e., whether the nozzle 13 would make an interference with the mounted component 12a.

Figure 4A:
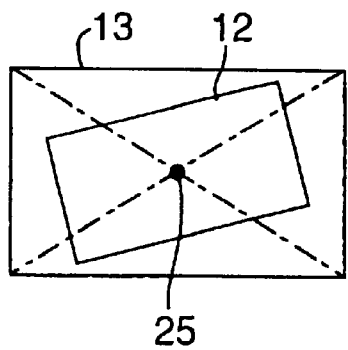
FIGS. 4A and 4B are diagrams for describing a determination of an interference between a component holder and a component already mounted on a substrate.
Figure 4B:
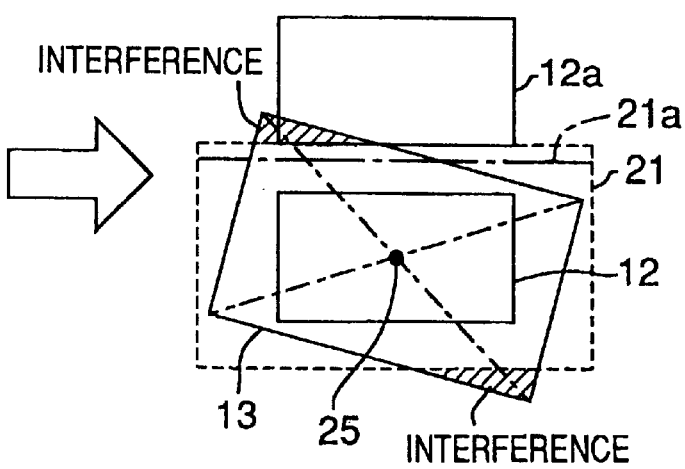

FIGS. 4A and 4B schematically illustrate a spatial relationship between the nozzle 13 and the component 12 held by the nozzle in which it is assumed that the component 12 is improperly inclined relative to the nozzle. In this instance, according to the conventional technique, as best shown in FIGS. 4A and 4B, the nozzle 13 is turned around to direct the component in a proper direction, which in turn can result in an interference between the nozzle 13 and the mounted component 12a.

However, according to the present invention, a new concept or reference area (safety region) 21 is used for determining whether a nozzle interferes with a mounted component. The reference area 21 is predetermined in light of a position of neighboring, mounted component 12a. In this embodiment, an outer periphery of the mounted component 12a defines a part of an outline of the reference area 21. Alternatively, as shown by a long and short dotted line in FIG. 4B, the reference area may be spaced away from an outer periphery of the mounted component, leaving a certain clearance therebetween for safety.

An amount of horizontal and/or angular correction of the component relative to the nozzle in FIG. 4A is calculated in light of a known configuration and reference position of the nozzle. Also, actual displacement of the component is determined by comparing an image of the component taken by the recognition device with a known configuration and reference position of the nozzle. The reference position of the nozzle 13, which is supposed with its center located at center 25 of the nozzle 13 as shown in FIG. 4A, is stored in the controller 7 or imaging device 20. Also, in order to suppose the reference area 21, also used are a shape, size and position of the component 12a mounted on the substrate, stored in the controller 7.

Referring back to FIG. 2, using a calculation result made at step S15, a determination is made at step S16 as to whether the nozzle 13 stays within the reference area 21. When even a small part of the nozzle 13 is positioned outside the reference area, it is determined that the nozzle 13 would interfer with the mounted component 12a. Then, at step S19 the component 12 is discarded from the nozzle 13 without being mounted on the substrate. If, on the other hand, the nozzle 13 stays fully within the reference area 21, it is determined that no interference would occur between the nozzle and the mounted component 12a. Then, the program proceeds to step S17 where horizontal and/angular displacement, or an amount of correction of the component 12, is calculated. Based upon this calculation, displacement of the component 12 is removed by moving the nozzle 13. Then, the component 12 is placed on the substrate at step S18. After completion of placement or discard of the component at step S18 or S19, the nozzle moves back to the supply section 2 for a next pickup operation of a component. Afterwards, the program returns to step S11 so that the above-described procedures are performed again.

A clearance between reference area 21 and an outline of a mounted component may vary from one direction to another direction depending upon features of neighboring components. Also, reference area 21 may be extended in one direction in the form of strip if no neighboring component exists in that direction and, therefore, there is no necessity for considering possible interference in that direction.

If a component held by the nozzle has a greater height than a neighboring, mounted component, it can be determined that there is no possible interference between the nozzle and the mounted component. Therefore, in this instance, the controller performs only steps S13 to S15 for every component without making any determination at step S14. This also applies to the following embodiments.

Third Embodiment

Referring to the drawings, description will be made to another system and method according to a third embodiment of the present invention. Basic structure of appearance and operation of the system of this embodiment is similar to that of the first embodiment described above, except for a process for prevention of interference between a nozzle and a component.

Referring to FIG. 5, there is shown a process performed by controller 7. In this process, at step S21, component 12 is received on a nozzle. Then, a position of the component 12 held by the nozzle is recognized at step S22, which is used at step S23 for determining whether the component can be mounted on a substrate. If it is determined at step S23 that the component is unable to be mounted on the substrate in a proper way, the program proceeds to step S29 where the component is discarded at a collect station. The operations described above are the same as those described for the first embodiment.

If, on the other hand, it is determined at step 23 that the component is held so that it can be mounted on the substrate, another determination is made at step S24. At this step, it is determined whether a height of the component 12 held by nozzle 13 is greater than that of component 12a around which the component 12 will be mounted. If the height of the component 12 to be mounted is equal to or greater than that of the mounted component 12a, the program proceeds to step S27 where a horizontal and/or angular correction of the nozzle is calculated. Based upon this calculation, the component 12 is placed on substrate 18 at step S28.

Figure 6A:
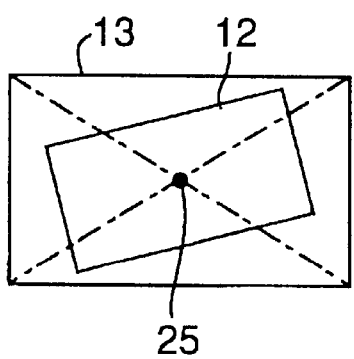
FIGS. 6A and 6B are diagrams for describing a determination of interference according to the method of FIG. 5.
Figure 6B:
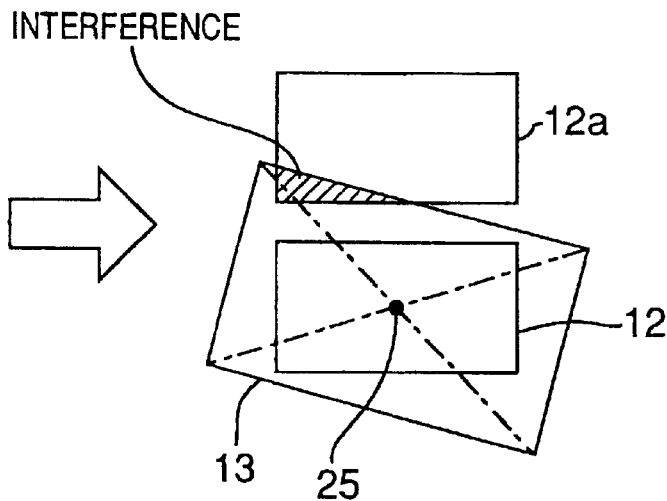

If, on the other hand, the height of the component 12 is less than that of the mounted component 12a, the program proceeds to step S25 where a position of the nozzle 13 above the substrate 18 at a mounting position of the component 12 is calculated. For example, if component 12 is inclined relative to substrate 18 as shown in FIG. 6A, calculated are possible positions of the nozzle 13 on the substrate 18 in which the component 12 is oriented in a proper direction as shown in FIG. 6B.

Based upon this calculation, another determination is made at step S26 as to whether the nozzle 13 overlaps at least part of the component 12a which is supposed to have been mounted in a predetermined position on the substrate 18. If an overlap is established, it is determined that the nozzle 13 would interfer with the mounted component 12a. In this instance, the component 12 is transported to a discard station at step S29 without being mounted on the substrate. Otherwise, the program proceeds to step S27 where an amount of horizontal and/or angular correction of placement head 3 is calculated. Based upon this calculation, a necessary horizontal and/or angular correction is made to the placement head 3. Then, the component 12 is mounted on the substrate 18. After mount or discard of the component 12, the nozzle 13 is returned to the supply section 2 for a pickup operation of a subsequent component and, then, the program proceeds again to step S21.

As described above, although in the second embodiment a reference area is considered for determination of possible interference, in this embodiment possible interference is determined using a position in which a neighboring component 12a is supposed to have been mounted on the substrate. For this purpose, information of not only shape and size of the nozzle 13 but also shape and size and mounted position of component 12a are stored in the controller 7. Using this information, the controller 7 calculates positions occupied by the nozzle 13 and the component 12a.

Fourth Embodiment

Next, referring to the drawings, description will be made to another component mounting apparatus and method according to a fourth embodiment of the present invention. Basic structure of appearance and operation of the system of this embodiment is similar to that of the first embodiment described above, except for a process for prevention of interference between a nozzle and a component.

Referring to FIG. 7, there is shown a process performed by controller 7. In this process, at step S31, component 12 is received on a nozzle. Then, a position of the component 12 held by the nozzle is recognized at step S32, which is used for determining at step S33 whether the component can be mounted on a substrate. If it is determined at step S33 that the component is unable to be mounted on the substrate in a proper way, the program proceeds to step S39 where the component is discarded at a collect station. The operations described above are the same as those described for the first embodiment.

If, on the other hand, it is determined at step 33 that the component is held so that it can be mounted on the substrate, another determination is made at step S34. At this step, it is determined whether a height of the component 12 held by the nozzle 13 is greater than that of a component 12a around which the component 12 will be mounted. If the height of the component 12 to be mounted is equal to or greater than that of the mounted component 12a, the program proceeds to step S37 where an amount of horizontal and/or angular correction of placement head 3 is calculated. Based upon this calculation, the component 12 is placed on the substrate 18 at step S38.

Figure 8A:
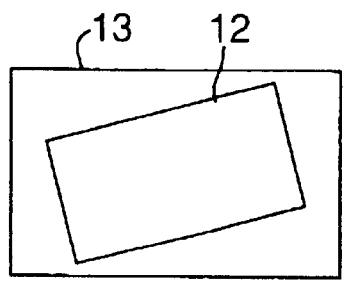
FIGS. 8A to 8C are diagrams for describing a determination of interference according to the method of FIG. 7.
Figure 8B:
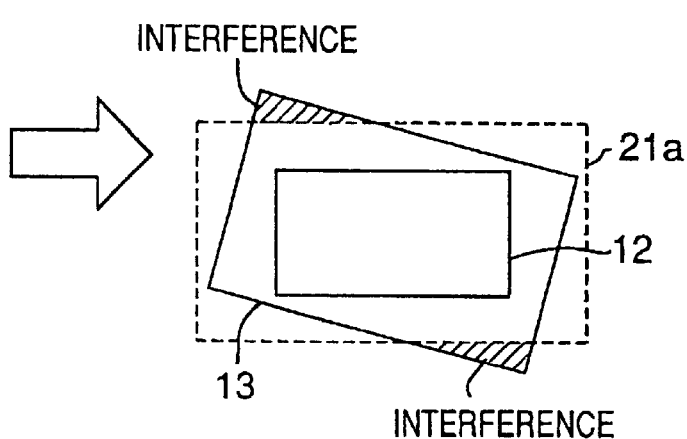

If, on the other hand, the height of the component 12 is less than that of the mounted component 12a, the program proceeds to step S35 where, as shown in FIG. 8B, irrespective of a size of the mounted component 12a, a reference area 21a is determined from a size of component 12 during image processing so that the reference area is greater than the size of the component 12 by a certain amount. A size of an expanded area of the reference area can be determined arbitrarily. The size of the reference area may be determined using a predetermined limit distance from a neighboring component, stored in the controller as shown in FIG. 21.

Referring back to FIG. 7, it is determined at step 36 whether the nozzle 13 stays within the reference area 21a in light of size and shape of the nozzle 13, reference position of the nozzle 13 (e.g., its center 25), and position of the component 12 relative to the nozzle 13 determined at step S32. If not, the program proceeds to step S39 where the component 12 is discarded at the collect station. Otherwise, the program proceeds to step S37 where an amount of horizontal and/or angular correction of placement head 3 is calculated. Based upon this calculation, a horizontal and/or angular correction is made to the placement head 3. Then, the component 12 is mounted on substrate 18 at step S38. After mount or discard of the component 12, the nozzle 13 is returned to the supply section 2 for a pickup operation of a subsequent component and, then, the program proceeds again to step S31.

Figure 8C:
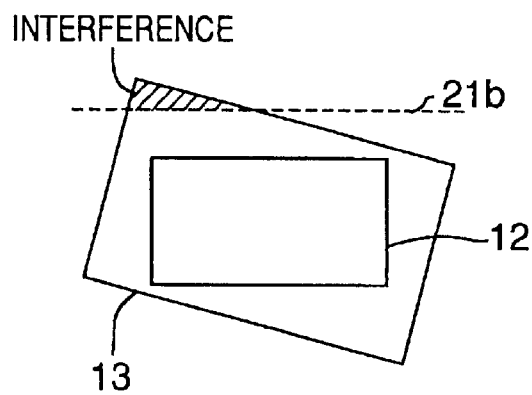

The size of the reference area 21a may be varied from one direction to the other direction according to an arrangement of components on the substrate, in particular, a neighboring component or components. Also, the reference area 21a may be extended in a certain direction in the form of strip if no neighboring component exists in that direction and, therefore, there is no necessity for considering a possible interference in that direction. Further, if there is a possible interference only in one direction, as shown in FIG. 8C the reference area may be defined only in that direction.

In the embodiments described above, an amount of horizontal and/or angular displacement of component 12 relative to nozzle 13 is determined by comparing a known shape and size, and a preset reference holding position of the nozzle 13 (e.g., a center of the nozzle 13), with an image picked up by recognition device 5. However, instead of using such known shape and size, and preset reference holding position of the nozzle 13, an amount of horizontal and/or angular displacement of component 12 relative to nozzle 13 may be determined from an image picked up by the recognition device 5 and then used for the position determination. This also ensures a precise determination of whether there is a possible interference between the nozzle 13 and a mounted component 12a.

Also, though in the previous embodiments whether nozzle 13 interferes with mounted component 12a is determined by image processor 20, such a determination may be performed by controller 7.

Further, although in the previous embodiments placement head 3 is transported in a horizontal plane by robot 4, a rotary mounting device having a plurality of placement heads arranged on a circle and rotating successively for mounting, may be used instead.

Fifth Embodiment

Figure 9A:
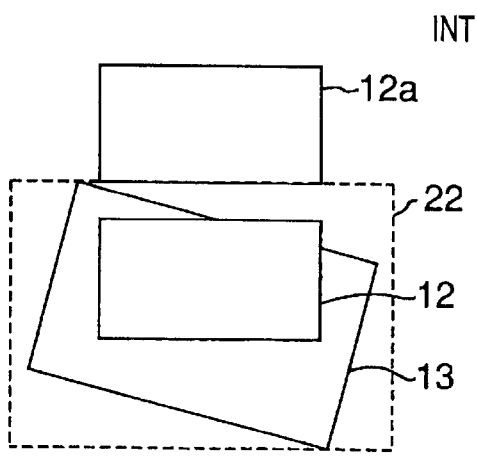
FIGS. 9A to 9D are other diagrams for describing a determination of interference.
Figure 9B:
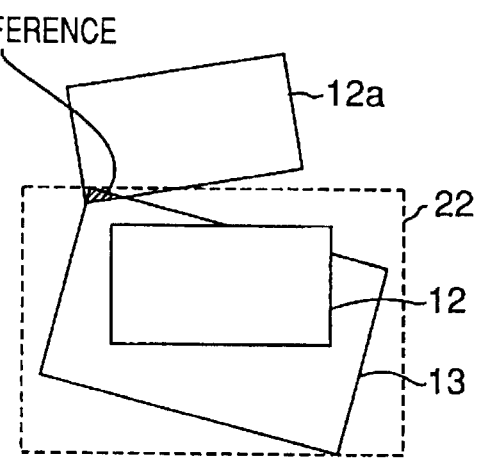
Figure 9C:
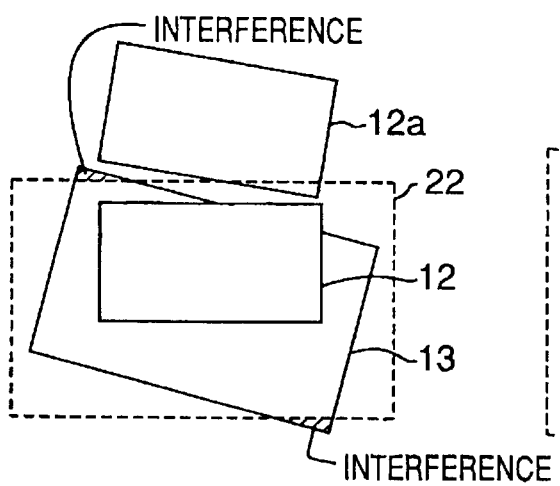

Referring to the drawings, description will be made to a system and method according to a fifth embodiment of the present invention. In this embodiment, the system has another imaging device for picking up an image of substrate 18 in order to establish a position of component 12a mounted on the substrate, and thereby to determine a possible interference between nozzle 13 and the mounted component 12a. For example, as shown in FIG. 9A, in a previous embodiment it is determined whether nozzle 13, of which horizontal and/or angular position has been adjusted, falls at least partly in reference area 22 defined by a position of mounted component 12a. However, a certain condition may be thought that, as shown in FIG. 9B, component 12a is mounted on a substrate in an inclined fashion with respect to a predetermined direction and position. In this instance, even though nozzle 13 stays within reference area 22, there still exists some possibility to cause interference between the nozzle 13 and the mounted component 12a. However, when the component 12a is inclined in an opposite direction as shown in FIG. 9C, no interference would occur even if a part of nozzle 13 is located outside reference area 22.

Figure 10:
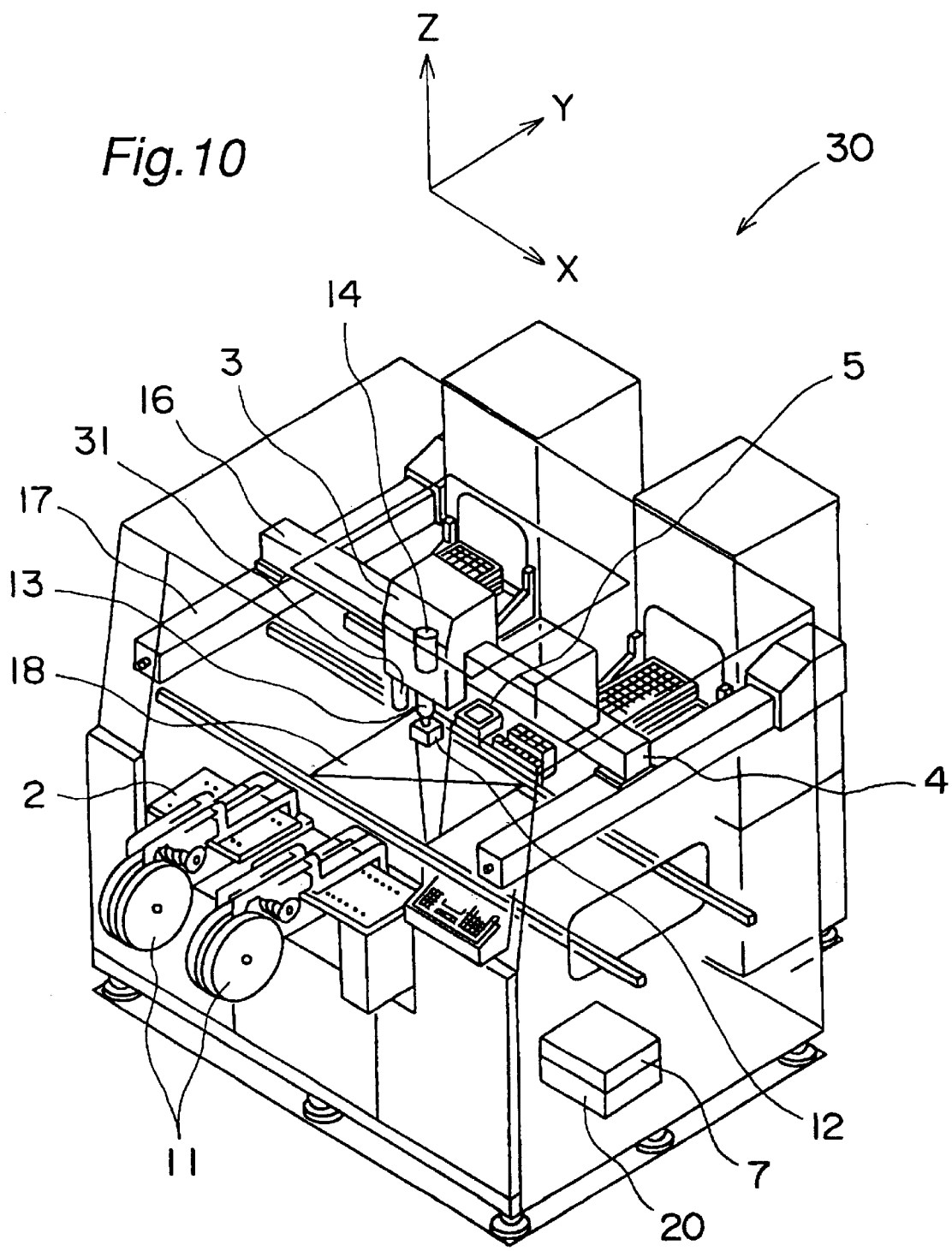
FIG. 10 is a schematic perspective view of a component mounting apparatus of the present invention.

Therefore, according to this embodiment, a position of mounted component 12a is obtained and then used in determination of whether nozzle 13 interferes with the mounted component 12a. For this purpose, as shown in FIG. 10, a component mounting apparatus 30 has a second image processor 31 for recognition of component 12a mounted on substrate 18. Preferably, the image processor 31 is positioned on placement head 3 near nozzle 13. Other structures of the mounting apparatus 30 are similar to or identical to those described in the previous embodiment, so that no description is made thereto.

Figure 11:
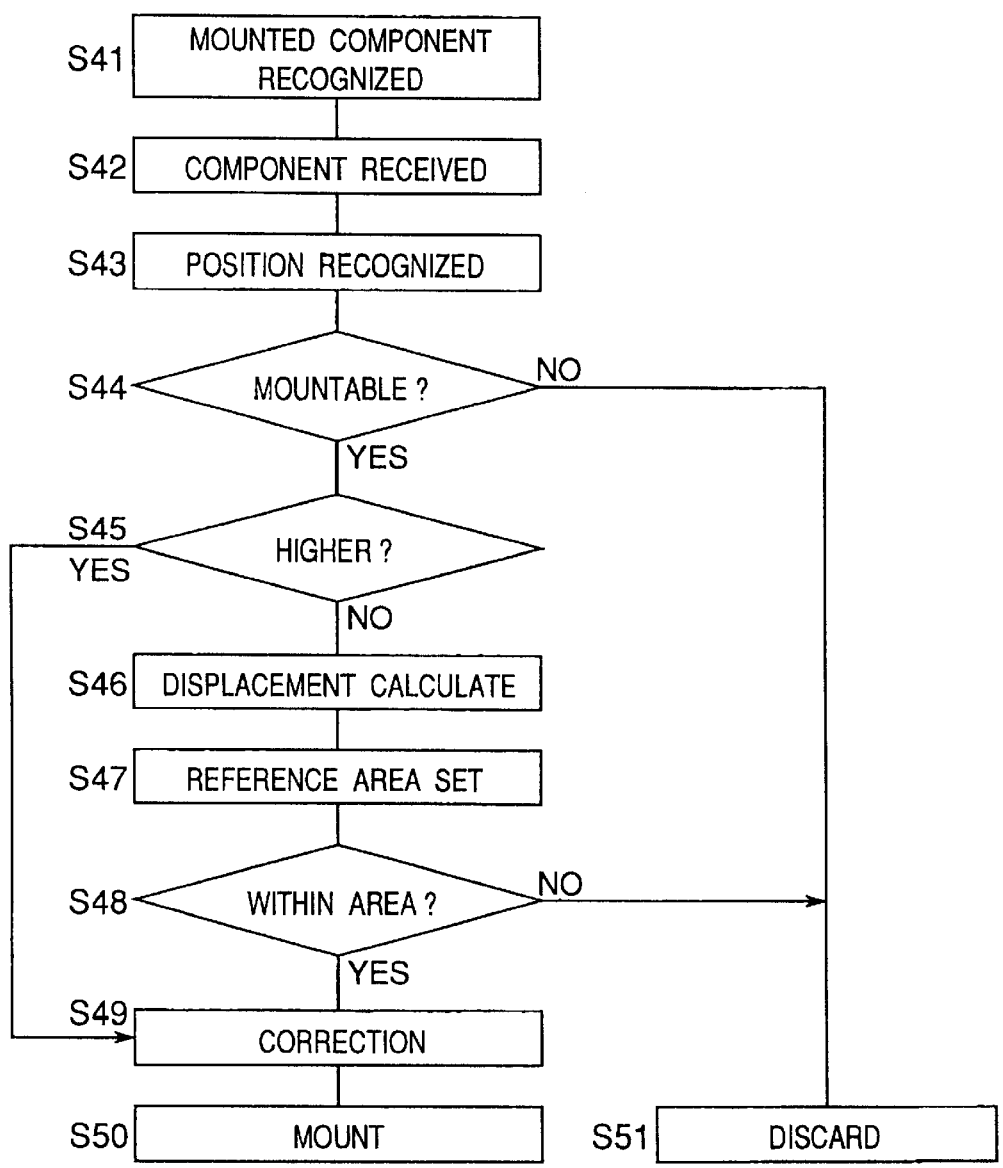
FIG. 11 is a flowchart showing a method for mounting components on a substrate according to another embodiment of the present invention.

Referring to FIG. 11, there is shown a flowchart indicating a component mounting process performed by controller 7. The flowchart is similar to that described with respect to the second embodiment, except that image processor 31 recognizes a position of component 12a mounted on substrate 18 at step S41. This recognition is carried out after placement head 3 has reached a position where it places component 12 on the substrate 18, preferably after completion of placement of component 12. An image of the mounted component 12a is transmitted to image processor 20 or the controller 7 where it is used at step S47 to define a reference area.

Figure 9D:
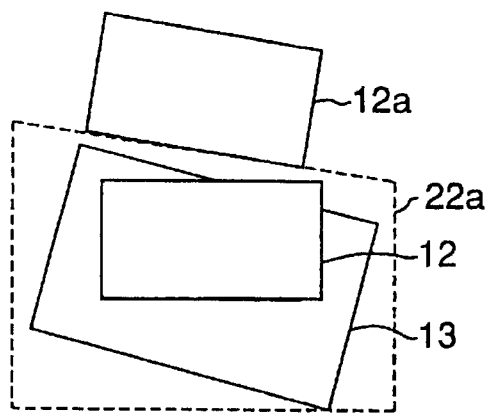

For example, as shown in FIG. 9D, a deformed reference area 22a may be defined for inclined component 12a. The deformed reference area 22a ensures to prevent interference between nozzle 13 and component 12a placed improperly. Also ensured is a proper mounting of component 12, which would be prohibited from being mounted when supposing a non-deformed reference area as shown in FIGS. 9A to 9C. The image processor 31 may be provided on another moving member rather than the placement head 3. In this instance, the image processor 31 with the moving member may oppose the substrate 18 for recognition of the substrate while the placement head 3 is away from the substrate 1.

Sixth Embodiment

Figure 12:
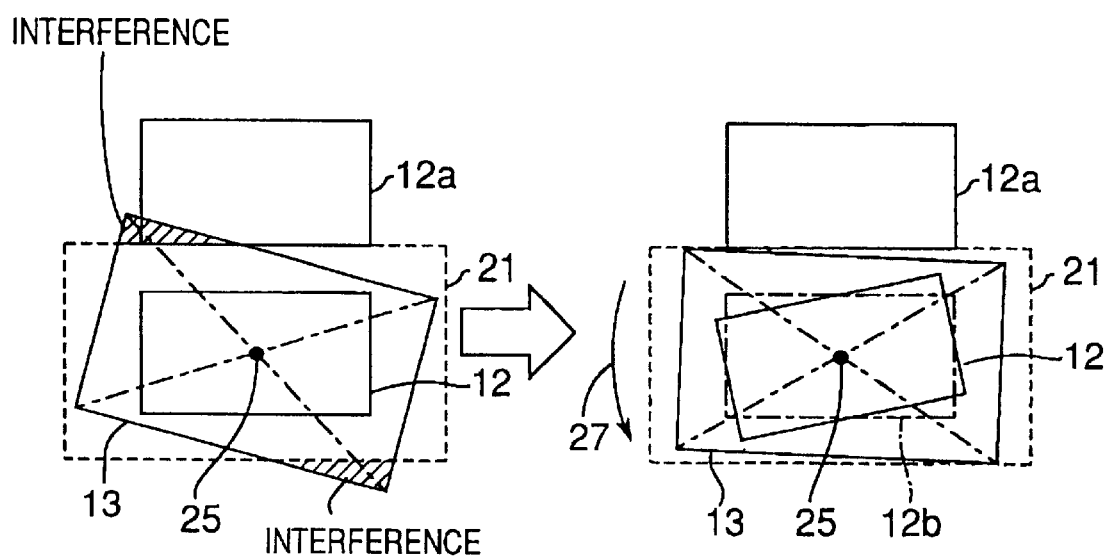
FIGS. 12A and 12B are diagrams for describing a determination of interference according to the method of FIG. 11.

Referring to the drawings, description will be made to another system and method according to a sixth embodiment of the present invention. In this embodiment, component 12 which is discarded due to possible interference between a nozzle and a mounted component is allowed to be mounted on substrate 18 by adjusting a horizontal and/or angular position of the nozzle while preventing interference of the nozzle and the mounted component. That is, in the second embodiment, as shown in FIG. 4B if the nozzle 13 protrudes beyond reference area 21, component 12 is discarded without being mounted on substrate 18. However, as shown in FIGS. 12A and 12B, even in the same condition nozzle 13 rotates in a direction indicated by arrow 27 so that it stays wholly within reference area 21, allowing component 12 to be mounted on substrate 18. This not only prevents interference between the nozzle and a component on the substrate, but also increases an efficiency of mounting.

Although in this embodiment the nozzle 13 is rotated into the reference area, the nozzle may be transported linearly in a direction away from component 12a on substrate 18. Also, the rotational movement may be combined with linear movement.

The above adjustment of the nozzle 13 can cause component 12 to incline as indicated by a solid line, relative to a proper position on the substrate indicated by a long and short dotted line 12b. This may increase a likelihood of interference between component 12a mounted on the substrate and the nozzle 13 during placement movement for a subsequent component. However, interference is prevented by reducing a size of reference area 21 according to inclination in formation of a region for the subsequent component. The nozzle 13 is discarded unless the nozzle 13 enters entirely within the reference area.

Figure 13:
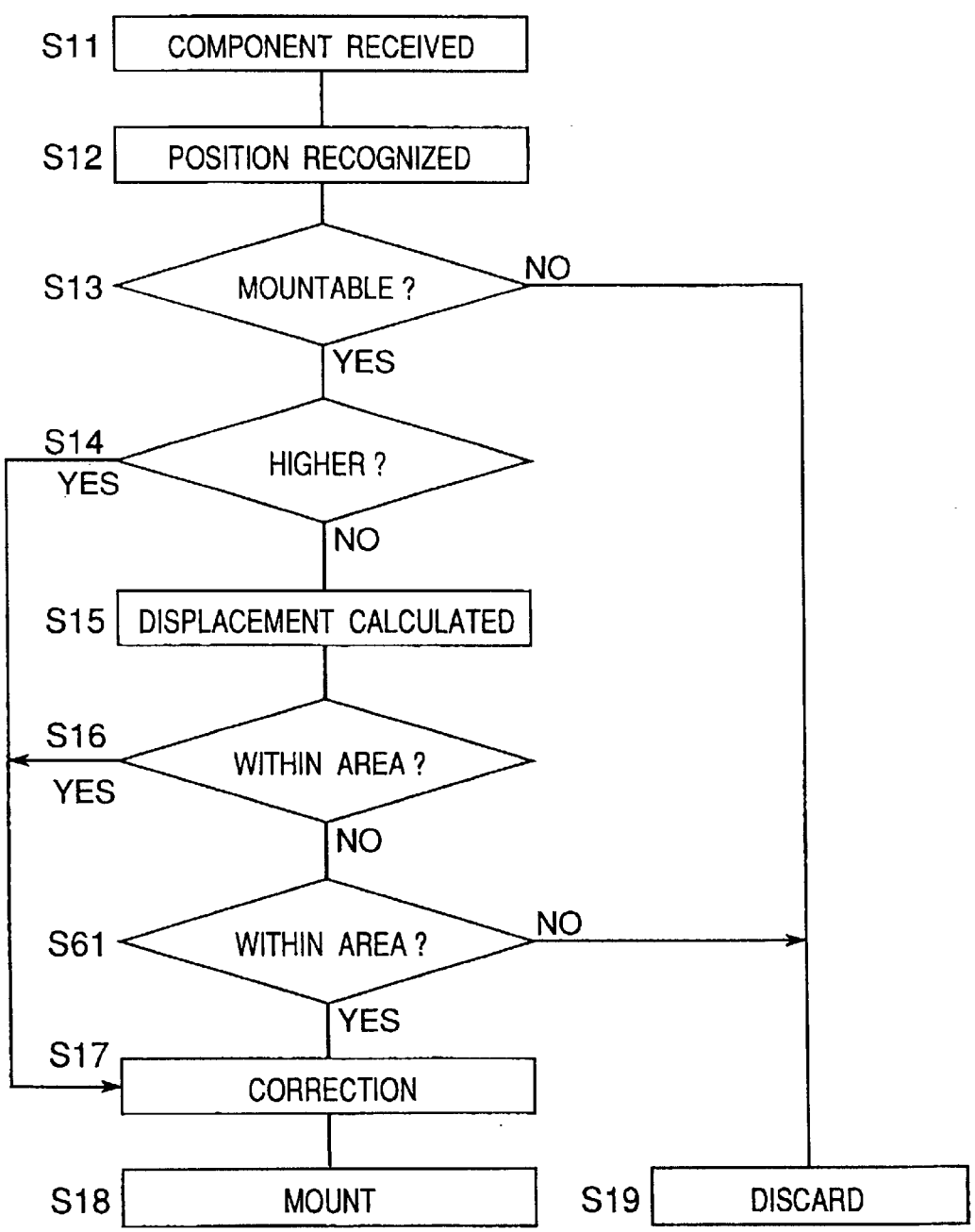
FIG. 13 is a flowchart showing a method for mounting components on a substrate according to another embodiment of the present invention.

FIG. 13 is a flowchart showing a component mounting method of this embodiment. In this flowchart, processes performed at steps S11 to S19 are the same as those described with regard to the second embodiment of the present invention. If it is determined at step S16 that nozzle 13 is outside a reference area, another determination is made at step S61 as to whether the nozzle would be entirely within the reference area by linear and/or rotational movement of the nozzle. If the result is affirmative, a position of the nozzle is adjusted at step S17 so that the nozzle stays entirely within this region. Then, a component held by the nozzle is mounted on the substrate at step S18. Otherwise, the component 12 is discarded at a collect station.

Although this embodiment has been described in combination with the second embodiment, it can equally be combined with other embodiments described above using a reference area. In particular, in combination of this embodiment with the fifth embodiment, since possible interference is determined after recognition of position of component 12a on a substrate, inclination of component 12 provides no adverse affect with respect to mounting of a subsequent component.

Seventh Embodiment

Figure 14:
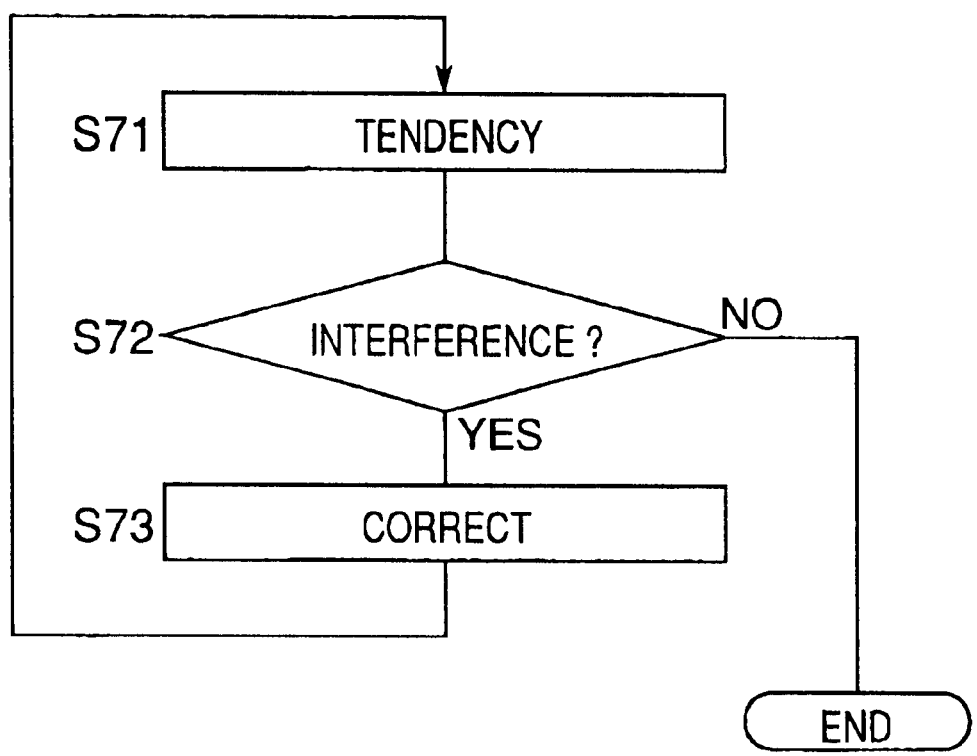
FIG. 14 is a flowchart showing a method for mounting components on a substrate according to another embodiment of the present invention.

Referring to a flowchart in FIG. 14, description will be made to another system and method according to a seventh embodiment of the present invention. In this embodiment, data of interference between nozzle 13 and component 12a on substrate 18 is collected during a process of mountings for one or more than a certain number of substrates. Then, the collected data is used for protection against interference during subsequent mountings. For example, in mountings for a predetermined number of substrates, interference data including the number, degree, and position of possible interference caused between a nozzle and a component is memorized. This data is processed statistically, for example, to obtain a tendency of interference or inclination. This tendency shows, for example, when and/or where interference is likely to occur. Therefore, if that tendency is confirmed at step S72, an adjustment is made to cancel or reduce the tendency, thereby preventing interference between nozzle 13 and component 12a on substrate 18.

The adjustment may be made by rotation and/or horizontal movement of component 12 to be mounted and/or component 12a mounted on the substrate. If, by this adjustment, a former tendency is eliminated but another tendency is presented in a predetermined number of subsequent mountings, a further adjustment is made to cancel or reduce the latter tendency. In this instance, adjustment may be made to either or both of components 12 and 12a. When adjusting both components, an amount of adjustment may be divided substantially equally for two components.

Eighth Embodiment

Referring to the drawings, description will be made to another system and method according to an eighth embodiment of the present invention. As described with reference to FIG. 3, when the height of a mounting component 12 is greater than that of a mounted component 12a, no interference will occur between nozzle 13 and the mounted component 12a. This in turn means that no interference would be made by mounting components in an order in which a shorter component is mounted earlier than a taller component. Therefore, according to this embodiment, components are mounted in a reverse order of their height, thereby preventing interference of a nozzle and a mounted component or components without any necessity of defining a reference area, or of recognizing a size of the mounted component or components.

In this case, it is not necessary to determine a mounting order for all components to be mounted on the same substrate. This is because nozzle 13 may interfere only with a component 12a positioned in an area in which component 12 will be mounted, and may not interfere with a component 12a positioned away from the area. Then, it is advantageous to define several blocks on the substrate, each of which includes only components that would cause interference between the nozzle and a mounted component. In this instance, an order of mounting of components is determined for each block. Also, it is unnecessary to determine possible interference between the nozzle holding a component to be mounted in one block and a mounted component or components in another block away from the one block. Each height of the components to be mounted on one substrate is available from component data pre-stored in controller 7.

Ninth Embodiment

Referring to the drawings, description will be made to another system and method according to a ninth embodiment of the present invention. In this embodiment, interference determination using reference area 21 is performed for a rotary type component mounting apparatus.

Figure 15:
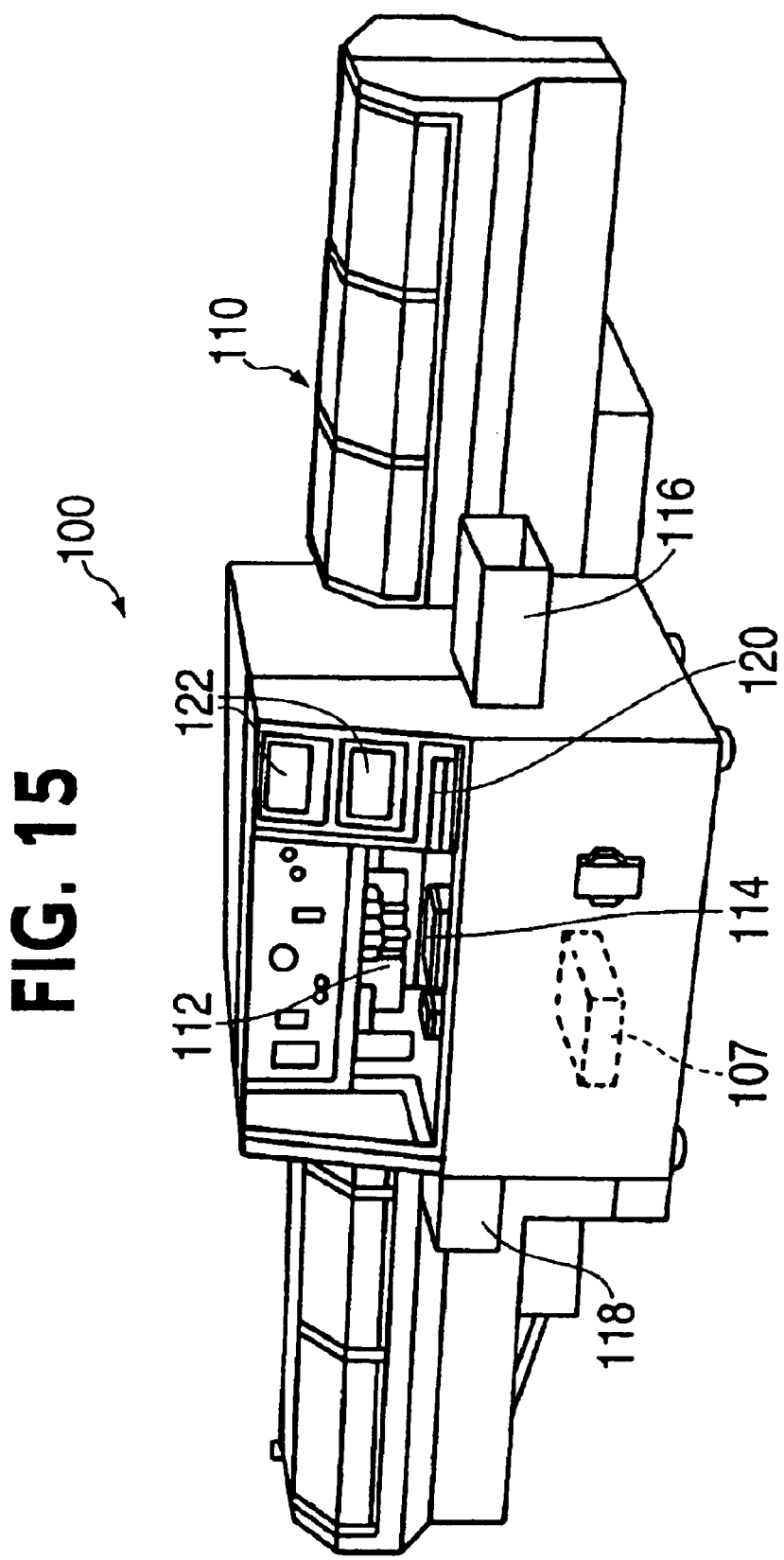
FIG. 15 is a schematic perspective view of another component mounting apparatus of the present invention.
Figure 16:
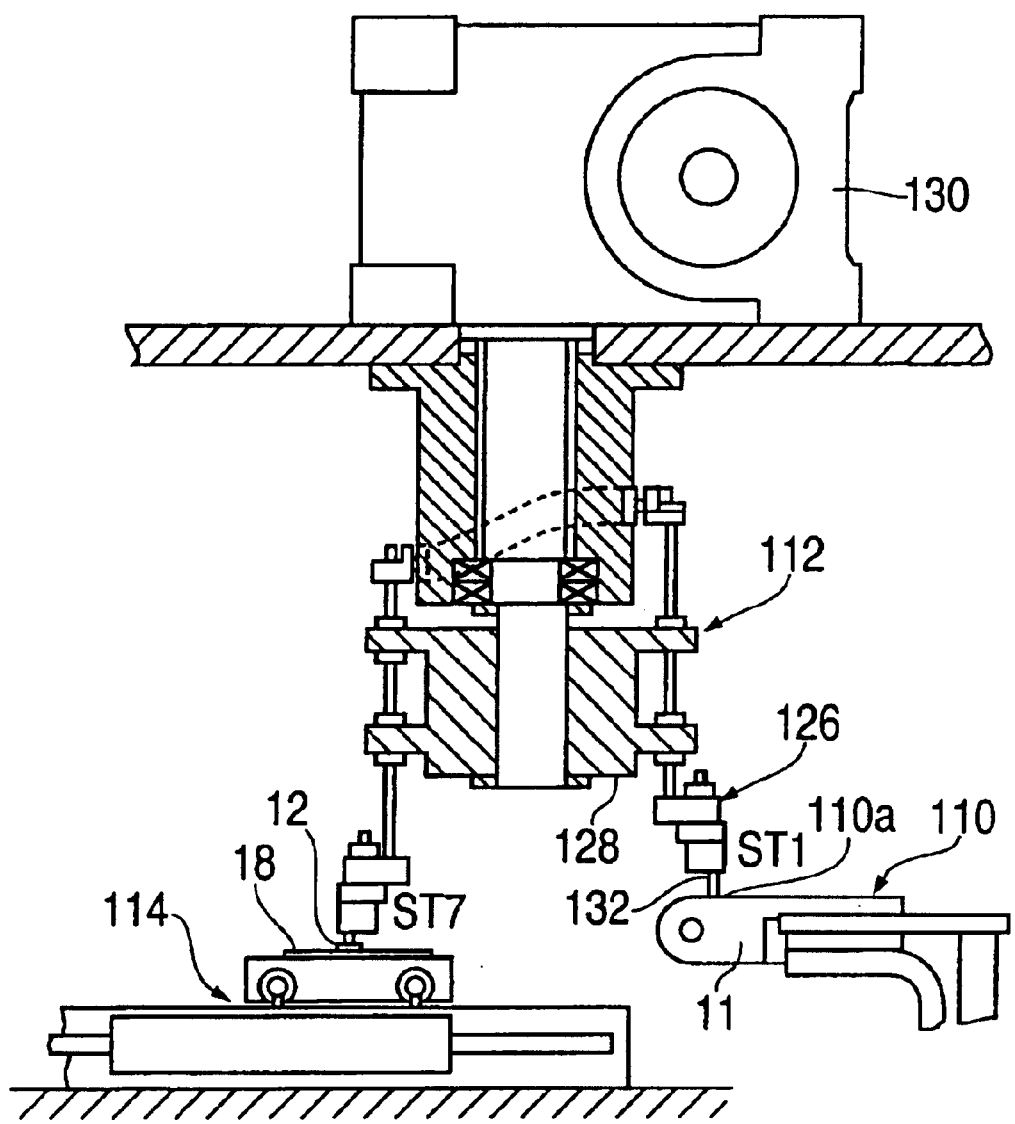
FIG. 16 is a side elevational view showing a part of another component apparatus with a rotary head.

As shown in FIGS. 15 and 16, a component mounting system 100 generally includes a component supply section 110 for supplying electronic components successively, a rotary head 112 for receiving and then mounting the components on a substrate 18, and an X-Y table 114 for positioning the substrate . With this arrangement, the substrate 18 is supplied from a substrate supply section 116 and then positioned on the X-Y table 114. The rotary head 112, on the other hand, receives components 12 from the component supply section 110. A position of each component on the rotary head 112 is corrected, if necessary. A corrected component is then mounted on the substrate 18. After completion of mountings of the components, the substrate is transported from the X-Y table to a substrate discharge station 118.

In addition, the mounting system 100 has an input section 120 for data input, a display station 122 for data display, and a controller 107 for controlling operations of devices in the system. Input data includes sizes of components and control data, and display data includes data showing a condition of the devices in the system.

Referring to FIG. 16, the component supply section 110 has a set of parallel parts cassettes 11 each holding a number of electronic components 12. The set of parts cassettes is supported so that it can move back and forth in a direction perpendicular to the drawing, which ensures that each of the parts cassettes is to provide a component for a component supply region 110a. The X-Y table 114 is supported so that it moves between the substrate supply section 116 and the substrate discharge section 118. At the substrate supply section 116, the table 114 reaches a position communicated with a substrate inlet where it receives a substrate 18 on which components will be mounted. Then, the table 114 holds and then transports the substrate 18 into a placement position where components are mounted thereon by the rotary head 112. At the placement position, the table 114 moves left to right and back and forth so that each component is mounted at a predetermined, corresponding position on the substrate. After completion of mountings of the components, the table 114 moves to a position adjacent to the substrate discharge section 118 for discharge of the substrate to the substrate discharge station 118.

Figure 17:
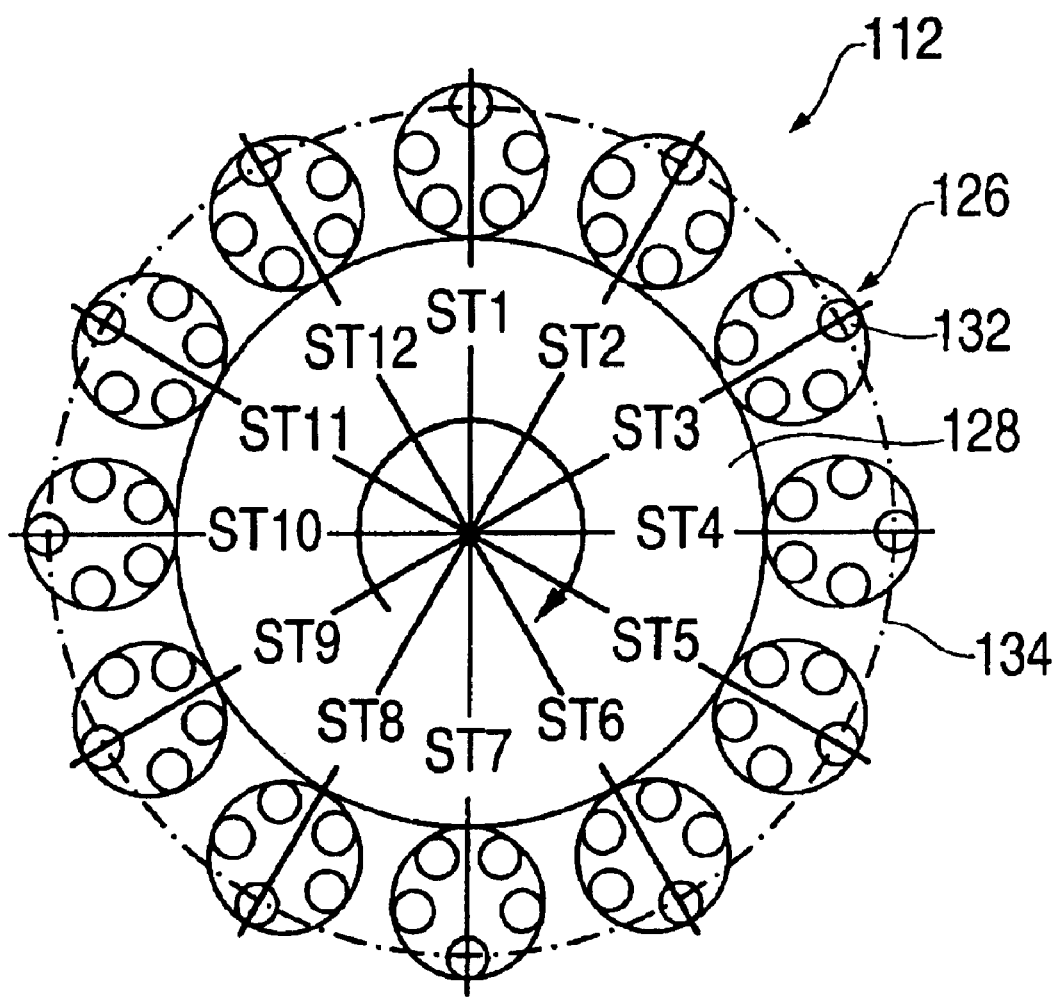
FIG. 17 is a plan view showing an arrangement of placement heads supported by the rotary head.

For example, as shown in FIG. 17, the rotary head 112 has 12 placement heads at regular intervals on its periphery. Each of the placement heads 126 has five nozzles 132 for holding components of different sizes, and is supported so that it moves up and down and rotates about a central, vertical axis thereof. This allows that, when receiving and mounting a component, each nozzle 132 takes an outermost position on a circle indicated by a long and short dotted line in FIG. 17.

In operation, each placement head 126 is transported by index rotation of rotary frame 128 from component supply position 110a of the component supply section 110 to an opposite, component placement position, and then back again to the component supply position 110a through various stations.

Discussion will be made to operations carried out at each station. At station 1 (ST1), i.e., drawing station, nozzle 132 faces a component supply position and receives component 12 from component supply section 110. Then, a thickness of the component held by nozzle 132 is measured at ST3 by a two-dimensional line sensor (not shown), which thickness is then transmitted to the system 100. The system 100 determines whether the thickness measured is less than a predetermined value. If this determination is affirmative, the system recognizes that no component is supported by the nozzle, or the component is incorrectly supported by the nozzle. Otherwise, at ST4 (i.e., pickup station), a two-dimensional CCD camera (i.e., displacement detector) picks up a plan image of the component held by nozzle 132 from below. Using this image, a horizontal and/or angular displacement of the component is determined, which is then transmitted to the system 100. At ST6, the nozzle rotates about its vertical axis according to determined, horizontal and/or angular displacement to orient the component in a proper direction.

At ST7 (i.e., mount station), by use of a result obtained from the image processor, the X-Y table is positioned. Then, placement head 126 moves down to place the component onto substrate 18 in position. If it has been determined at ST3 or ST4 that the component is incorrectly supported on the nozzle, or a wrong component is supported on the nozzle, the component is discarded from the nozzle at respective stations. At ST11 (i.e., nozzle select station), placement head 126 is rotated about its vertical axis, depending upon a component to be mounted, to place a corresponding nozzle 132 into an outermost position on circle 134.

Angular displacement may be corrected by rotation of the placement head. This results in a further horizontal displacement of a component, which is eliminated by movement of the X-Y table.

Next, discussion will be made to an embodiment for mounting a component by the system 100. This method is featured in that a determination is made as to whether a nozzle or a component supported on the nozzle would make an interference with a component mounted on a substrate, by use of various criteria.

Figure 18:
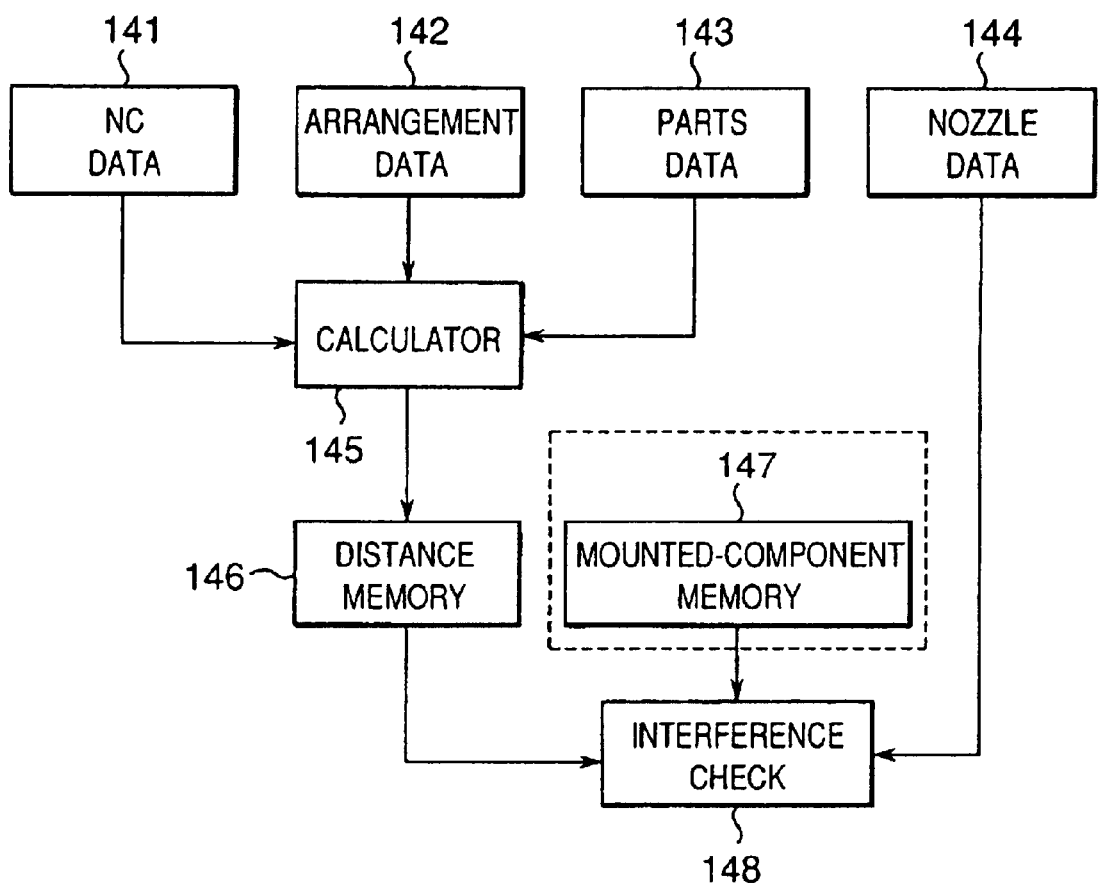
FIG. 18 is a block diagram showing portions of a controller of the component mounting apparatus.

For this purpose, as shown in block diagram of FIG. 18, system 100 includes various portions for its controlling. Controller 107 has an NC data store section 141 for storing data defining a mounting position of each component on a substrate; an arrangement data store section 142 for storing data of a supply position of each component defined in the NC data, and types of components; a component data store section 143 for storing data defining features such as a shape of each component and a type of each nozzle; a nozzle size data store section 144 for storing data defining a size of each nozzle; a calculator 145 for calculating a distance between every two neighboring components on the substrate in both, X and Y directions using data provided from the stores 141, 142, and 143; a distance data store section 146 for storing distances calculated by the calculator 145; and an interference judge 148 for judging existence of a possible interference using data from the data store section 146, and also determining a suitable clearance for each component and a mounting position.

In order to mount components onto a substrate, the system 100 includes an NC program, arrangement program, and component library, for example, stored therein. As shown in FIG. 19, the NC program 151 defines an order of components to be mounted and has supply positions (Z-number) and placement positions (X- and Y- coordinates) of the components. As can be seen from the drawing, one line of such data is prepared for each component.

As shown in FIG. 20, the arrangement program 152 defines data that includes a shape of a component for each Z-number by use of an associated code in order to distinguish a type of component to be supplied.

As shown in FIG. 21, the component library 153 defines data of component shape code, component feature code, operational condition, supply condition, and neighboring condition. For example, the component shape code defines a type of a component. The component feature code defines a size of the component. The supply condition defines how and by what the component is to be supplied. The neighboring condition defines a size of a nozzle and a clearance between neighboring components on a substrate in order to determine a possible interference between the nozzle, or a component to be mounted, and a mounted component.

Possible interference can be determined using a constant, limit distance defined for prevention of the interference. However, in this procedure nothing is considered about the neighboring condition of components. Therefore, according to the present invention, the limit distance is automatically determined by taking into account the neighboring condition for mounting of each component, rather than using a constant limit distance.

The NC program 151, arrangement program 152, and component library 153 are established and stored prior to actual mounting of components. Then, a program for mounting is generated by a combination of the NC program 151, corresponding to a substrate on which components are mounted, and the arrangement program 152 defining component supply positions and shapes of components designated in the NC library 153 with component shape codes.

Figure 22:
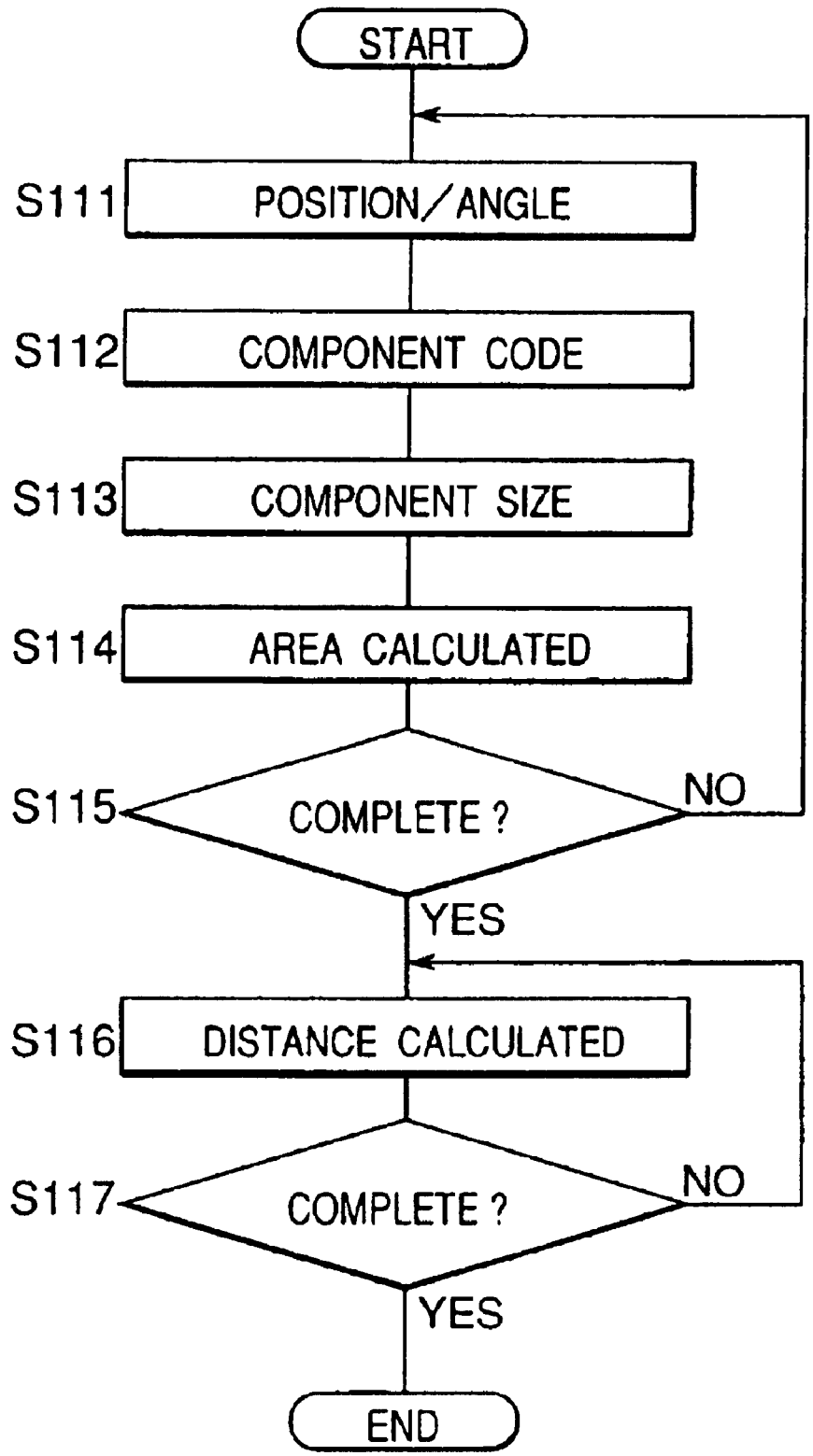
FIG. 22 is a flowchart showing a process for calculating a neighboring distance carried out by a distance calculator of FIG. 18.

FIG. 22 shows a flowchart for using distance calculator 145 to calculate a distance between two neighboring components mounted on a substrate. In this flowchart, at step S111 NC data store section 141 provides a mounting, horizontal and angular position (x and y coordinates and θ) of a component on the substrate. At step S112, the arrangement data store section 143 provides a shape code of the component. Then, at step S113 the component data store section 143 provides dimensions in the x and y directions of a component corresponding to the shape code. The distance calculator 145 calculates an area $(x_s, y_s)$ on the substrate to be occupied by the component at step S114. The area $(x_s, y_s)$ is stored in distance data store section 146.

Figure 23:
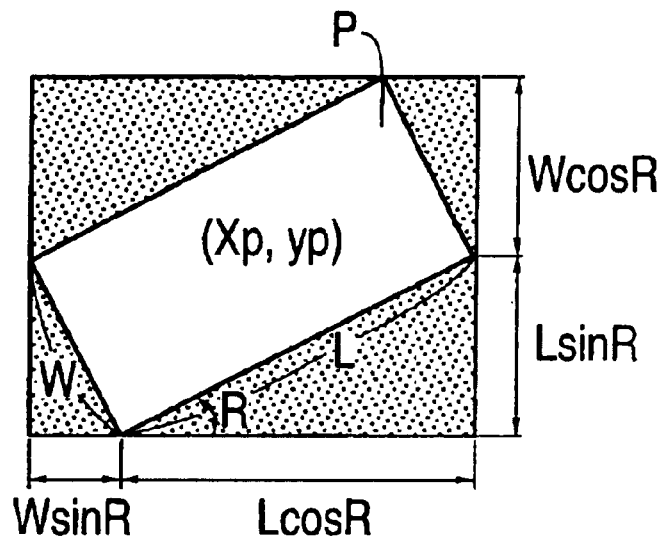
FIG. 23 is a diagram showing an area occupied by a component on a substrate.

For example, the area $(x_s, y_s)$ is defined by the following equations:

$$x_p - \frac{(L\cos R + W\sin R)}{2} \leq x_s \leq x_p + \left(\frac{L\cos R + W\sin R}{2}\right) \qquad (1)$$

$$y_p - \frac{(L\sin R + W\cos R)}{2} \leq y_s \leq y_p + \left(\frac{L\sin R + W\cos R}{2}\right) \qquad (2)$$

wherein, as shown in FIG. 23, $x_p$, $y_p$: coordinates of a center of the component, R: angle of the component, and L, W: dimensions of the component.

Figure 24:
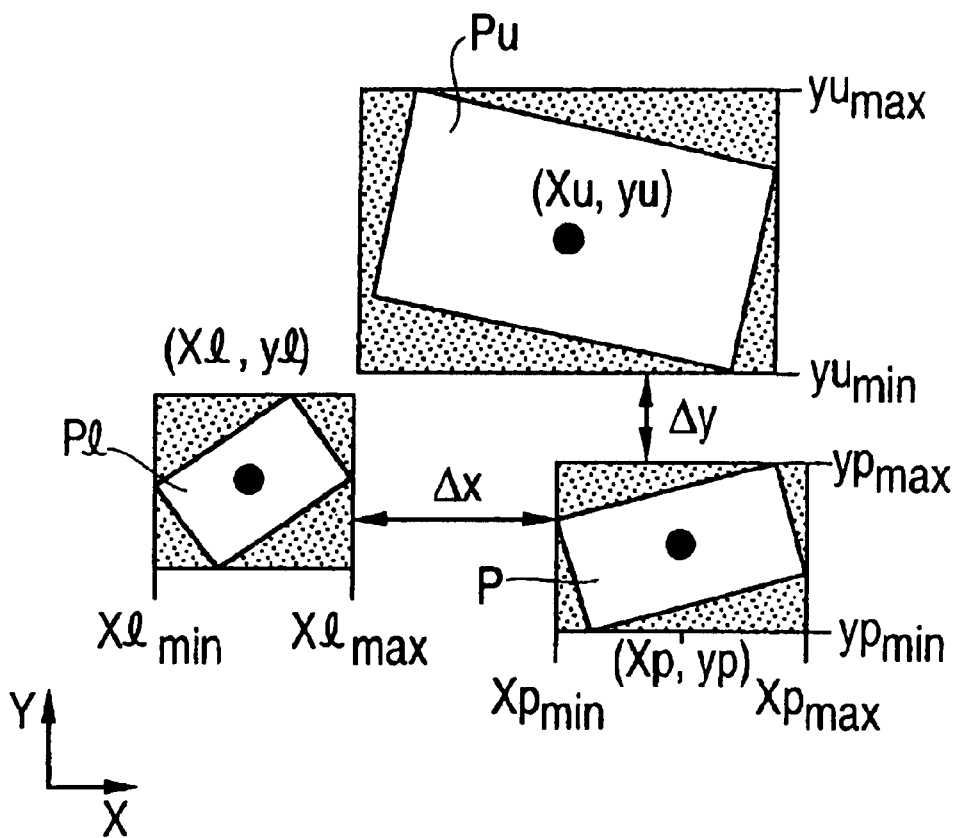
FIG. 24 is a diagram showing a distance between neighboring areas.

This calculation is performed for every component to be mounted on the substrate at step S115. Then, an area of one component P is provided from the distance data store section 146. Next, another component providing a minimum distance from the component P in either direction is determined. This process is illustrated in FIG. 24 in which, for one component P, selected in x-direction is component Pl that provides a minimum distance Δx from the component P, and selected in y-direction is another component Pu that provides a minimum distance Δy from the component P. For example, as shown in FIG. 24, the x-coordinate $(x_l)$ of the center of the selected component Pl and the y-coordinate $(y_u)$ of the center of the selected component Pu are defined as follows:

$$x_{l\,min} \leq x_{ls} \leq x_{l\,max} \quad (3)$$

$$y_{u\,min} \leq y_{us} \leq y_{u\,max} \quad (4)$$

Then, a minimum distance in the x- and y-directions from the components Pl and Pu, respectively, are determined as follows:Δ

$$\Delta x = x_{p\,min} - x_{l\,max} \quad (5)$$

$$\Delta y = y_{u\,min} - y_{p\,max} \quad (6)$$

wherein $x_{lmin}$ and $x_{lmax}$ are minimum and maximum x-coordinates of the component Pl, respectively, $y_{umin}$ and $y_{umax}$ are minimum and maximum y-coordinates of the component Pu, respectively, and $x_{pmin}$ and $y_{pmax}$ are minimum x-coordinate and maximum y-coordinate of the component P, respectively. The calculated distance Δx and Δy are stored in the distance data store section 46 at S117.

Figure 25:
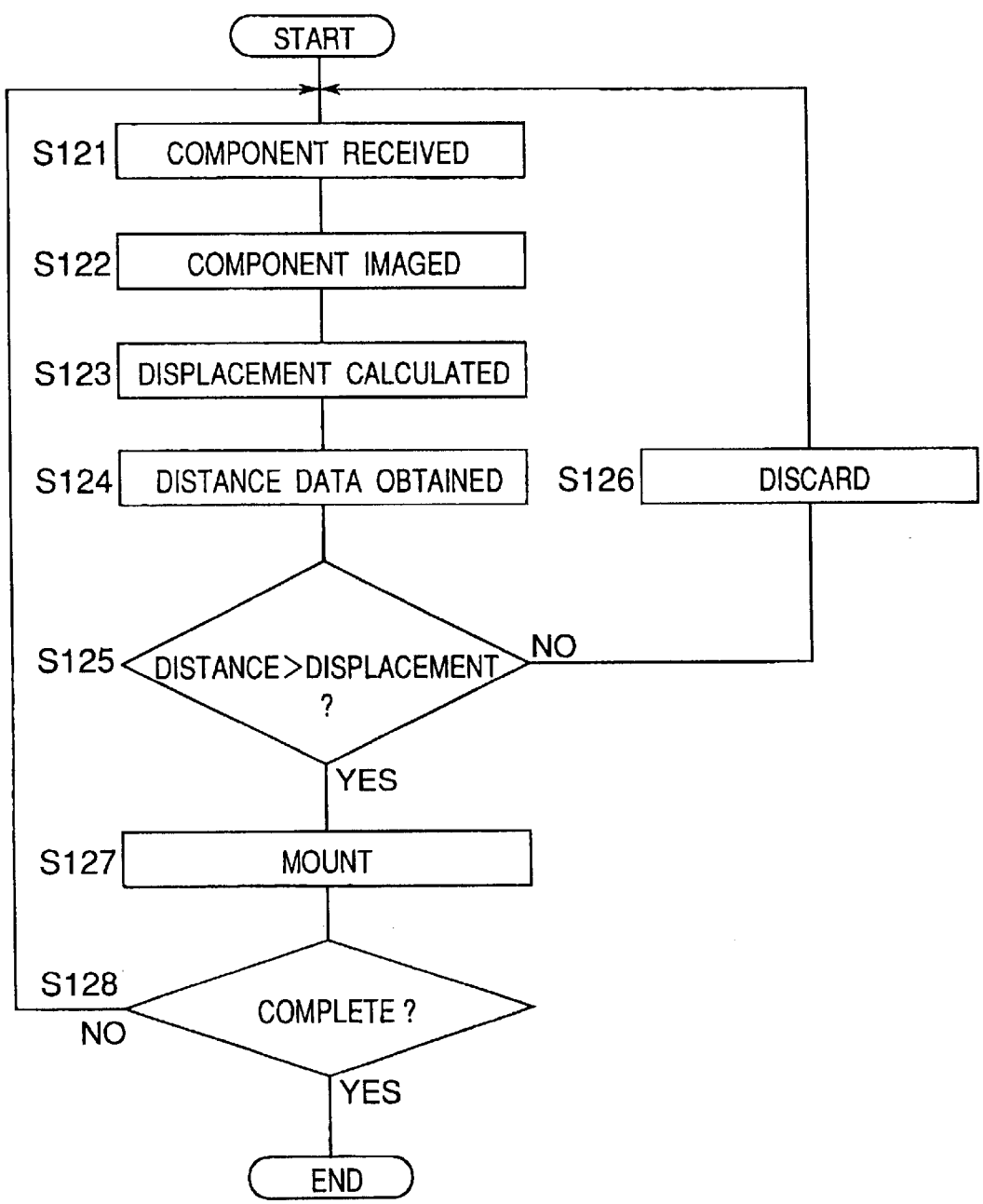
FIG. 25 is a flowchart for determining interference between a holder and a component.

Referring to FIG. 25, there is shown a flowchart of a procedure for determination of possible interference of a component, performed before mounting of components 12. In this program, according to a preset mount program, among a number of parts cassettes prepared at the component supply 110, one parts cassette 11 bearing a desired component 3 designated by the mount program is moved to the component supply position 110a. Component 12 is received by nozzle 132 of placement head 126 positioned at the component supply section ST1 of the rotary head 110a at step S121.

Then, the rotary head 112 is subject to index rotation to transport the placement head 126 with the component into the recognition station ST4 where the component is recognized by a two-dimensional CCD camera at step S122. The image recognized by the recognition device is used to determine a relative relationship between nozzle 132 and component 12 in the x and y directions at step S123. That is, at this step, offsets of the nozzle 132 from the component 12 in the x- and y-directions are determined. Each offset bears a plus or minus sign. Then, neighboring distance information for the component supported by the nozzle is retrieved from the distance data store section 146 at step S124. Then, another determination is made at step S125 as to whether offset of the nozzle 132 from the component, calculated at step S123, is less than the neighboring distance retrieved in either direction. If the offset is greater than the neighboring distance, there exists a possible interference between the nozzle, or the component supported on the nozzle, and another component mounted on the substrate. Therefore, at step S126 the placement head 126 is moved to discard station ST6 where the component is released from the nozzle into a collect container (not shown). The same component is then picked up again by the nozzle and, if there is no possible interference, mounted at a position of the substrate where the discarded component was intended to be mounted. If, on the other hand, the offset is less than the neighboring distance, the component is mounted at step S127 at a predetermined position of the substrate. If it is determined that the above steps have been performed for every component, the program is completed at step S128.

According to the mounting method of this embodiment, data is automatically generated for determining interference between a nozzle, or component supported on the nozzle, and another component mounted on a substrate for the nozzle and each component. This eliminates a complicated input process of respective neighboring distances at generation of a mounting program. Also, conventional data can be used in this method without any necessity of modification. This means that no complicated operation is needed for input of new data for a mounting. Also, possible interference is checked for each component independently, which prevents unwanted discard of a component capable of being mounted. This ensures an effective mounting of components. Further, immediately after discard of one component, the same component is mounted on the substrate without moving the rotary head, which ensures a reduction of total time for this mounting.

Tenth Embodiment

Discussion will be made to another system and process for mounting of a component according to a tenth embodiment of the present invention. Generally, in this embodiment, data of components mounted on a substrate are used for determination of possible interference.

This method is preferably used in the system 100 shown in FIGS. 15 to 17. In particular, in addition to structures shown in FIG. 18, the system 100 further includes a memory section 147 for holding a list of positions of components mounted on a substrate, which list is dynamically updated after mounting of each component. A nozzle interference check section 148 determines, for each component supported on a nozzle, whether it will make an interference with any component mounted on a substrate using data from the memory sections 144, 146 and 147. For each determination, a suitable neighboring limit distance is calculated for each component and its position.

Figure 26:
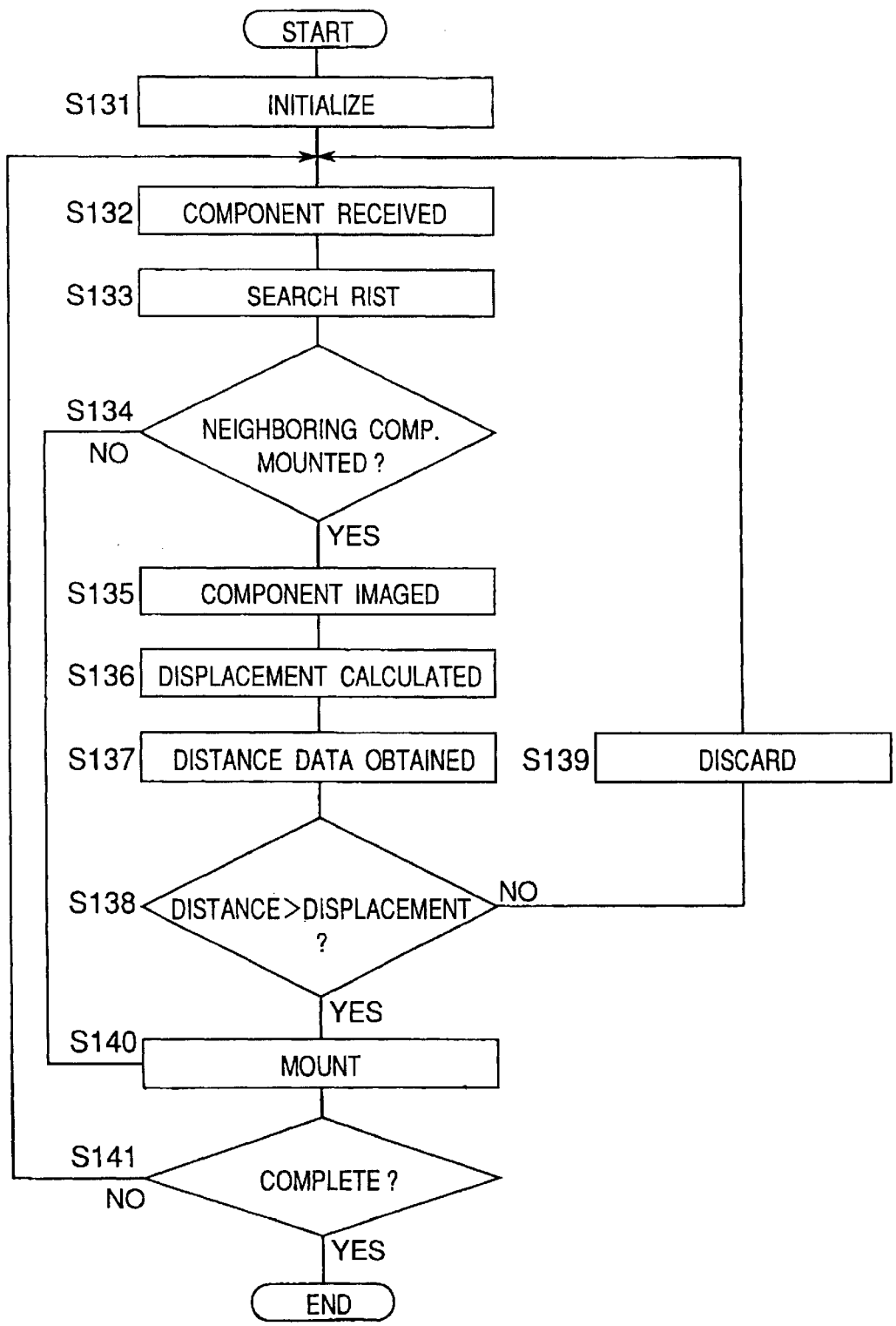
FIG. 26 is a flowchart showing processes carried out by a component data section.

Referring to FIG. 26, there is shown a flowchart indicating procedures carried out at the memory section 147 in FIG. 18 during mounting of a component. For example, when a new substrate is introduced into the system 100, the memory section 147 clears a list of positions of components mounted for a previous substrate at step S131. After a new component is supported on a nozzle at step S 132, it is determined at step S133 whether other components neighboring the new component on the substrate has been mounted on the substrate. If a neighboring component has already been mounted on the substrate, an interference check is made only for that neighboring direction according to procedures described in the ninth embodiment at steps that follow step S134. Otherwise, no interference check is made and the component supported by the nozzle is mounted on the substrate at step S139.

According to the mounting method of this embodiment, if data shows a possibility of interference between neighboring components but no interference would occur when considering actual mounting, an interference check is eliminated. This means that minimum checks are carried out, thereby shortening a time for mounting of each component.

In this embodiment, when it is determined that the nozzle or a component supported on the nozzle would interfer with a mounted component, the supported component is discarded without being mounted on a substrate and then another component is held by the nozzle for its mounting. In this instance, however, the system may simply be de-energized and then provide a warning to an operator of this system. This allows the operator to determine whether the component supported on the nozzle should be discarded.

Figure 28:
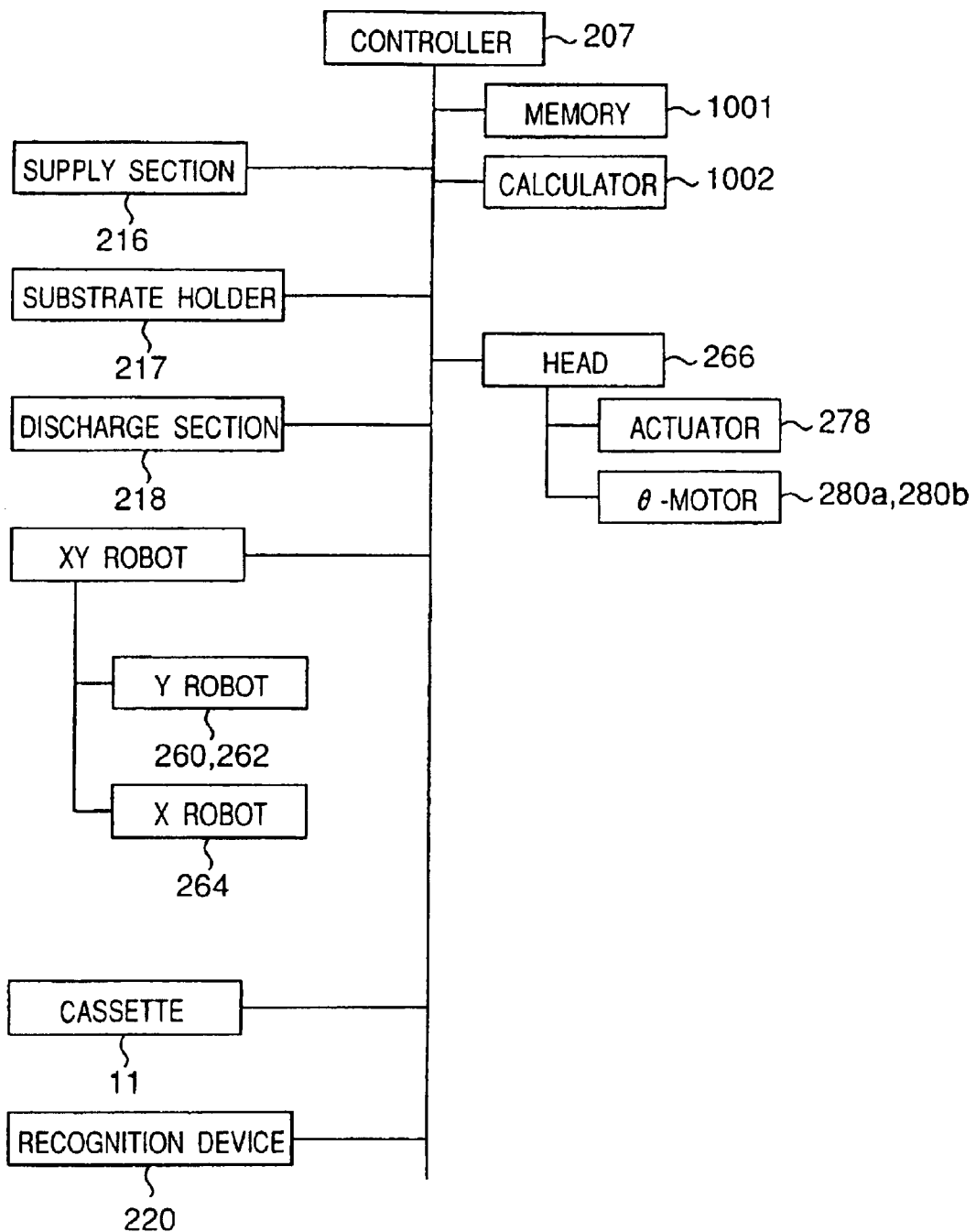
FIG. 28 is a block diagram showing portions of the component mounting apparatus of FIG. 27.
Figure 29:
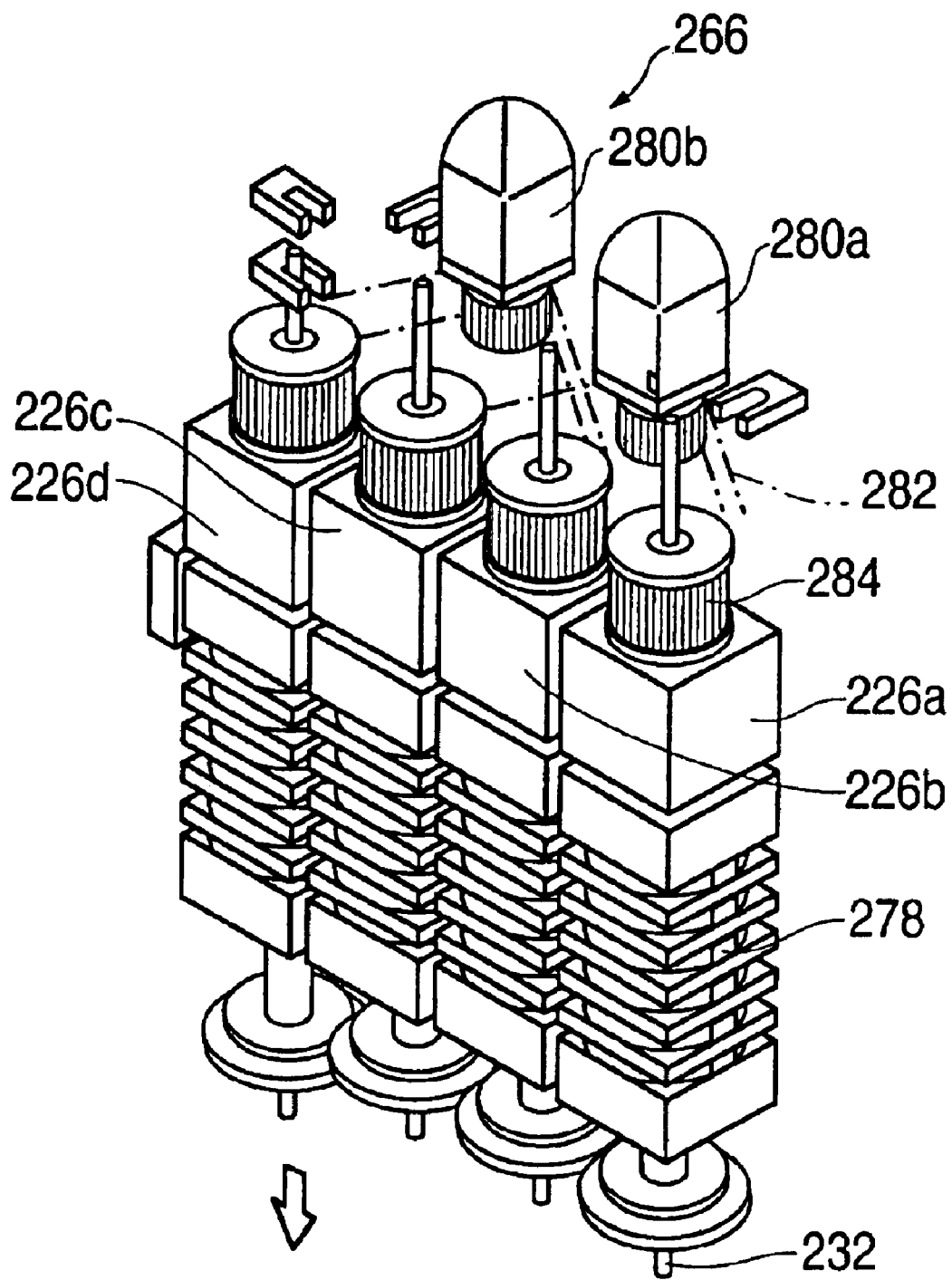
FIG. 29 is an enlarged perspective view of placement heads of the component mounting apparatus of FIG. 27.
Figure 30:
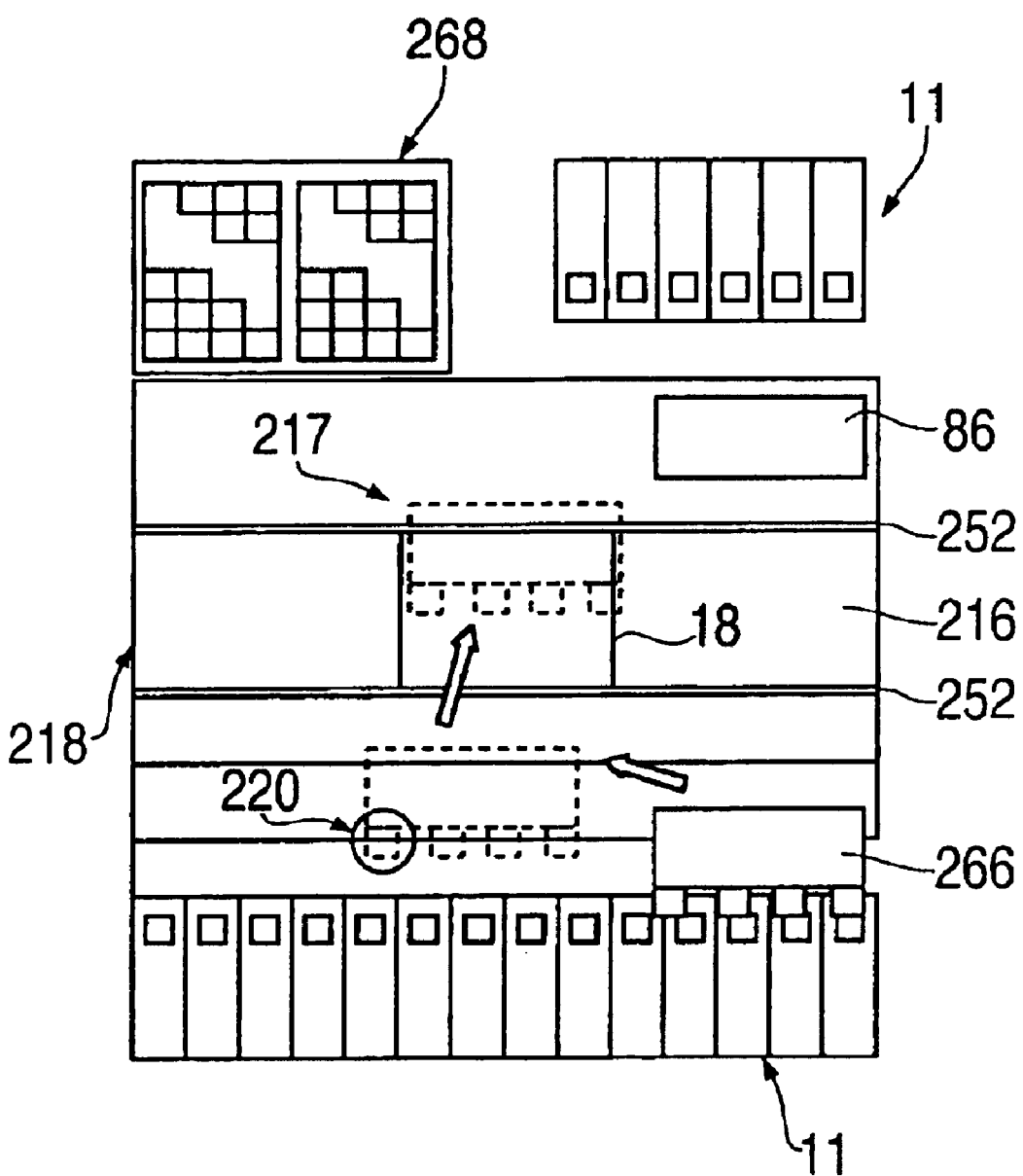
FIG. 30 is a schematic plan view of the component mounting apparatus of FIG. 27.
Figure 31:
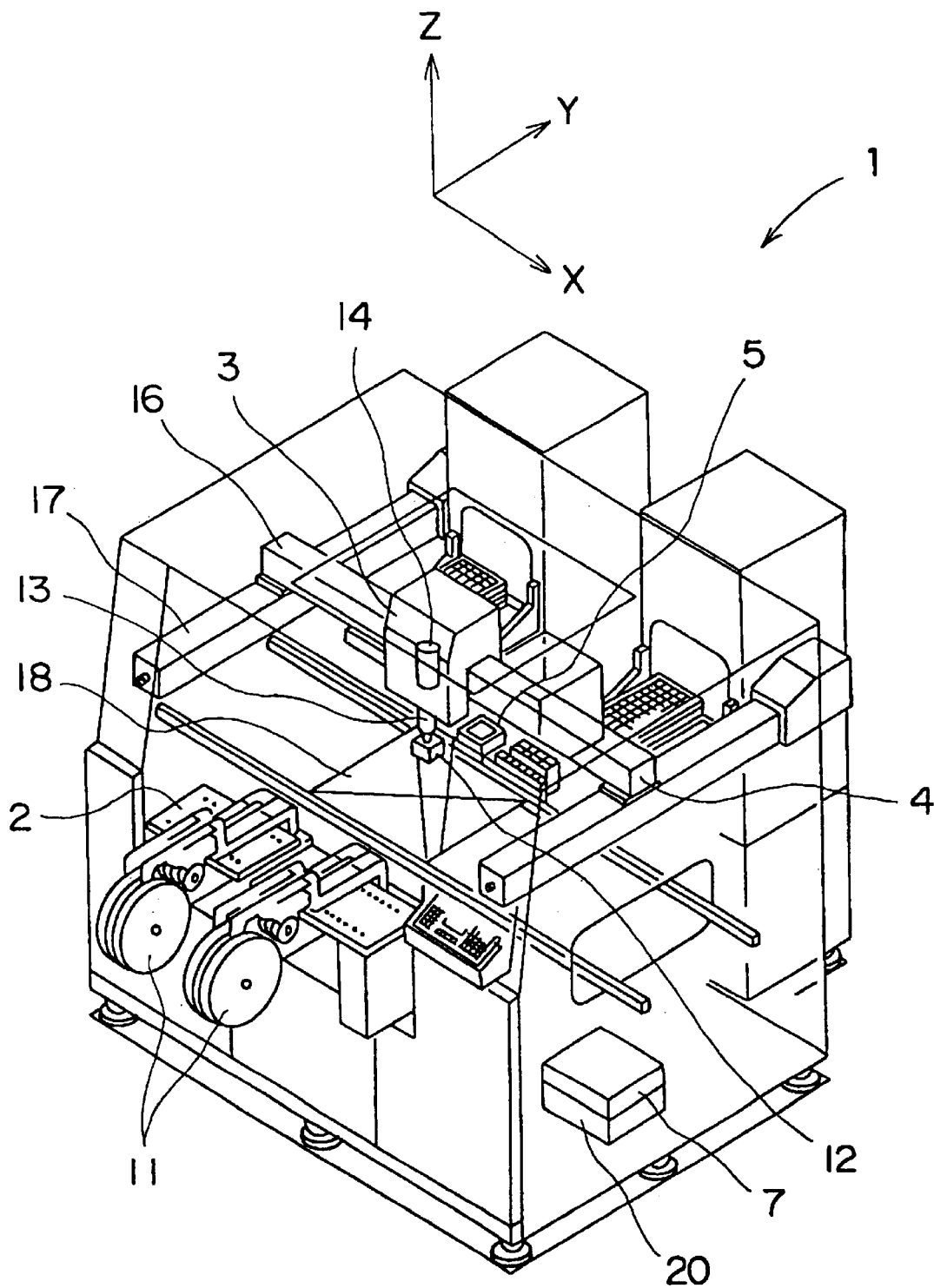
FIG. 31 is a schematic perspective view of a conventional component mounting apparatus.
Figure 32:
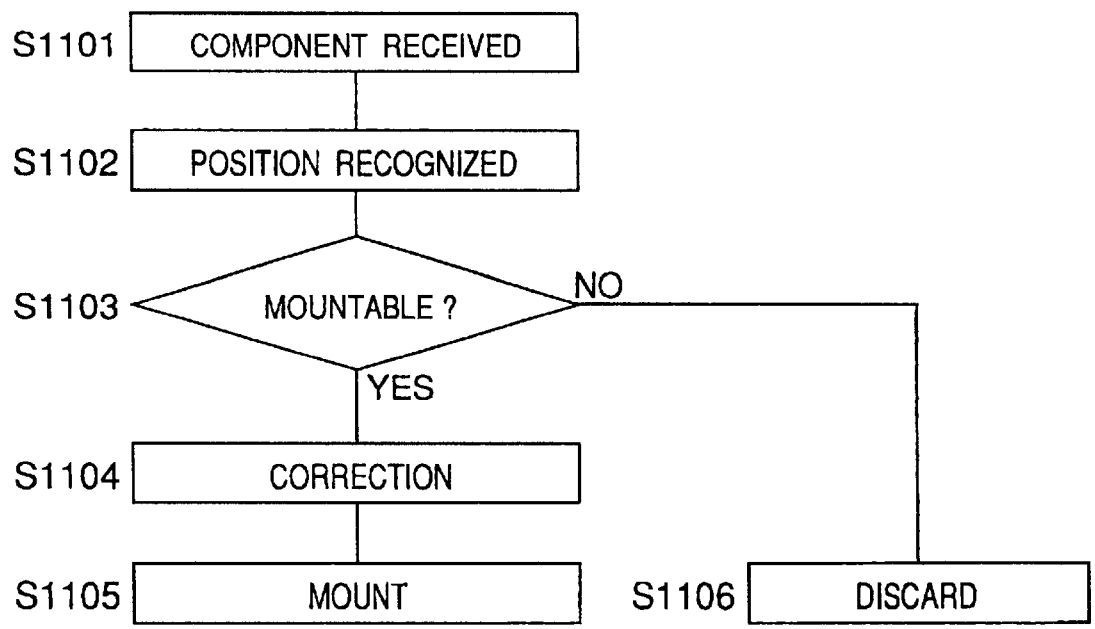
FIG. 32 is a flowchart showing a conventional component mounting process.
Figures 33A, 33B:
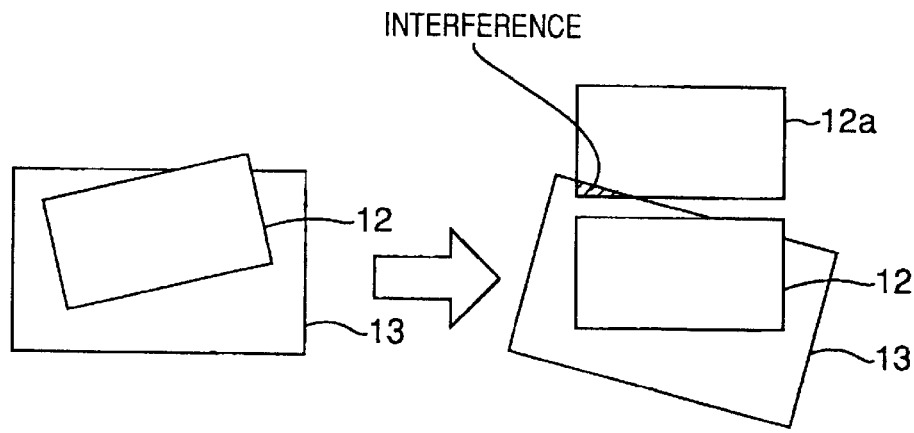
Figures 34A, 34B:
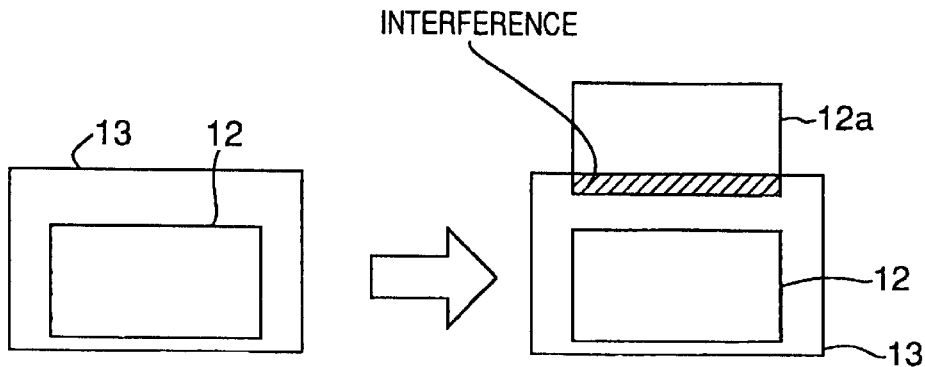

Although the ninth and tenth embodiments have been described in combination with the system 100 having rotary head 12, they are equally applied to system 1 in which a placement head moves back and forth on a substrate fixed in the system shown in FIG. 31, and another system shown in FIGS. 27 and 30 in which a placement head has a plurality of nozzles for supporting plural components simultaneously (see FIG. 29). Devices equipped in the system in FIG. 27 are operationally connected to each other as shown in FIG. 28.

System 200 has a guide portion including a pair of guide rails 252 each extending from a substrate supply section 216 through a substrate support section 217 to a substrate discharge section 218, and each located at a center of a base frame 250. This allows for substrate 18 introduced at the supply section 216 to be transported to the support section 217, where components are mounted thereon, and then discharged from the discharge section 218. The base frame 250 arranged above the substrate 18 is provided on its opposite sides with y-axis robots 260 and 262, which in turn support an X-axis robot 264 so that by driving of the y-axis robots 260 and 262 the x-axis robot moves back and forth in the x-direction. This allows a placement head 266 to be moved horizontally in the x- and y-directions. Each robot has a transport mechanism. For example, the transport mechanism has a nut secured to a movable member, and a threaded shaft secured to a fixed member and drivingly connected to a motor so that, by driving of the motor, the shaft rotates to transport the movable member back and forth alternately.

The placement head 266 supported by X-Y transport mechanism, with the x-axis robot 264 and y-axis robots 260 and 262, supports a component by its nozzle 232 for placement onto a substrate at a predetermined position of the substrate. The component may be a circuit chip such as a resistor or condenser supplied from a parts cassette, for example, and another large electronic device such as an IC connector (e.g., SOP or QFP) supplied from a parts tray, for example. Mounting procedures are controlled by controller 207 in FIG. 28 according to a program memorized and preset in memory 1001. The program may be inputted by manually using keys prepared at an operation panel, for example.

The parts cassettes 11 are arranged on opposite sides of the paired guide rails 252, e.g., on the right upper and left lower sides. Each parts cassette 11 has a strip-like component holder wound about a reel and holding a number of components or circuit chips such as resistors and condensers. The parts tray 268, on the other hand, can support a pair of two trays 268a extending perpendicularly to the guide rails, respectively. Each tray 268a slides toward the guide rails 252 according to the number of components to be supplied so that a component supply portion stays at a predetermined pickup position with respect to the y-direction. Typically, each tray 268a supports a number of electronic components such as QFPs.

An image processor 220 is provided near a substrate positioned by the pair of guide rails 252 in order to detect a two dimensional displacement or a position of a component supported by nozzle 232, and also to cancel displacement by movement of the placement head 266. The image processor has a recognition device at its bottom and a housing surrounding the recognition device. A number of light emitters such as light emitting diodes are provided stepwise inside the housing for illumination of a component supported on the nozzle. This allows for light to be emitted from various directions toward a mounting surface of the component, which ensures picking up a clear image of the component with a suitable angle irrespective of the type of the component. An angle is predetermined for each component according to preset component recognition data. An image picked up by the image processor 220 is processed by the controller to determine a center of the component and positions of electrodes to be used for correction of placement position and/or angle.

As shown in FIG. 29, transport head 266 has a component holder or a multiple head with a plurality of placement heads (e.g., first to fourth placement heads 226a to 226d of the same structure). Each placement head has a nozzle 232, an actuator 278 for moving the nozzle 232 up and down, and a pulley 284. Pulleys 284 of first and third placement heads 226a and 226c are drivingly connected through a timing belt 282 to a θ-rotation motor 280a so that the nozzles 232 of these heads can rotate about respective vertical axes thereof simultaneously. Pulleys 284 of second and fourth placement heads 226b and 226d are connected through another timing belt 282 to another θ-rotation motor 280b so that the nozzles 232 of these heads can rotate about respective axes thereof simultaneously. Each actuator 278 is made of an air-cylinder, for example, so that by turning on and off the air-cylinder the nozzle 232 moves up and down for receiving and holding a component. Although as shown in FIG. 29 rotation of the motor 280a is transmitted through one timing belt to rotate the nozzles 232 of the placement heads 226a and 226c, and rotation of the motor 280b is transmitted through another timing belt to rotate the nozzles 232 of the placement heads 226b and 226d, each of the placement heads 226a–226d can be connected to an individual motor for its θ-rotation. However, in order to reduce weight of a unit of the placement heads, the number of motors is minimized.

Each nozzle 232 of the placement heads is replaceable, and spare nozzles are accommodated in a nozzle stacker 286 mounted on the base frame 250 of system 200. Generally, various nozzles are used such as small sized nozzles for the chips of about 1.0 mm×0.5 mm, and medium sized nozzles for QFPs of about 18 mm×18 mm.

In operation, substrate 18 is introduced at the supply section 216 of the paired guide rails 252 and then transported into the holding section 217. Then, placement head 266 is moved by the X-Y robot transversely or horizontally in an X-Y plane to receive a predetermined component from the parts cassette 11 or parts tray 268. This component is then passed by a recognition device of the image processor 220 to recognize a position of the component supported by a nozzle. Using the position of the component, a motor rotates the nozzle 232 for correction of position of the component, if necessary. Then, the component is placed at a predetermined component mounting position on the substrate 18.

Each of the placement heads 226a–226d moves down the nozzle 232 vertically, i.e., in the z-direction, by driving of actuator 278 when receiving a component from parts cassette 11 or parts tray 268, and also when placing a component onto substrate 18. Also, a nozzle is replaced depending upon the type of the component.

By repetition of receiving and mounting, all components are mounted on a substrate. A substrate onto which every component has been mounted is transported from the holding section 217 to the discharge section 218. Then, a new substrate is introduced from the supply section 216 into the holding section 217 where components are mounted on this substrate.

An inertial force generated by acceleration and deceleration of a component, and an adhering force between the component and a substrate, should be considered when deciding a vacuum force applied from a nozzle to the component. Therefore, components are divided into several groups, i.e., high speed, medium speed, and low speed mounting components depending upon weight and size thereof.

Also, a plurality of placement heads may be used for simultaneous receiving and/or mounting of components.

In operation of the system 200, distance between all neighboring components is calculated according to the program shown in FIG. 22, and then stored in the memory unit 146. As shown in FIG. 30, substrate 18 is transported from the supply section 216 into the holding section 217. On the other hand, a component is picked up from parts cassette 211 or pats tray 268 by placement head 216 driven according to a mounting program. Next, similar to the ninth and tenth embodiments, possible interference is checked for a component supported on a nozzle according to the flowchart shown in FIG. 25. For this purpose, while the placement head moves above the image processor 220, the recognition device takes a picture of the component supported on the nozzle. Using the image picked up by the recognition device, position or displacement of the component relative to the nozzle is determined. Then, it is determined whether displacement of the component relative to the nozzle is less than a neighboring distance derived from the data unit 146. If the displacement is greater than the neighboring distance, the component is discarded. Otherwise, the component is mounted on the substrate. An interference check between the nozzle, or component supported on the nozzle, and a component mounted on the substrate is performed as described in the second embodiment.

Eleventh Embodiment

Discussion will be made to the eleventh embodiment of the present invention. This embodiment is directed to a computer readable recording medium. In this medium, a program having procedures for judging possible interference between nozzle 13, 132, and 232 and a mounted component 12a is recorded therein. For example, the program has several steps of receiving a component from the component supply by the component holder;

recognizing a component supported by the component holder;

using a result of the component recognition and determining whether the component is supported properly by the component holder;

when it is determined that a component is supported by the component holder so that this component will not be mounted properly, discarding the component to a collect station;

when, on the other hand, it is determined that a component is supported by the component holder so that this component will be mounted properly, determining whether a height of the component is greater than that of a component mounted on a substrate;

when it is determined that the height of the component is less than that of a mounted component, determining whether the component holder would make an interference with the mounted component during mounting of the component supported on the component holder;

when it is determined that the component holder would make interference with the component mounted on the substrate, discarding the component supported by the component holder into a collect section without mounting the component supported by the component holder;

when it is determined that the component holder would not make an interference with the component mounted on the substrate, determining whether a height of the component supported by the component holder is greater than that of a neighboring component mounted on the substrate; and when it is determined that the height of the component supported by the component holder is greater than that of the neighboring component mounted on the substrate, calculating an adjustment for correcting horizontal and/or angular displacement of the component supported by the component holder relative to the component holder.

The process has been described in detail in connection with another embodiment and, therefore, no further discussion will be made thereto.

The recording medium is preferably used for a system described in connection with the second embodiment, for example. Also, a program recorded in the recording medium is installed and then carried out in controller 7, 107, or 207.

Although in the process recorded in the medium a component supported by the component holder is discarded if it is determined that this component would make interference with another component mounted on a substrate, a horizontal and/or angular position of the nozzle and/or the component supported by the component holder may be adjusted so as not to interfere with the component mounted on the substrate during mounting of the component supported by the component holder, rather than discarding the component as described in connection with the sixth embodiment. Likewise, processes described in connection with other embodiments can also be memorized in respective recording mediums. In this case, each of the recording mediums is used for installation of a program into controller 7, 107, or 207.

In conclusion, the present invention prevents interference between a component holder, or a component supported by the component holder, and another component already mounted on a substrate even though there remains a slight clearance between the components, thereby producing a high quality substrate on which components have been mounted.

What is claimed is:

1. A method for mounting a component onto a substrate, comprising:

causing a holder to receive a component from a component supply and hold said component;

recognizing a position of said component while being held by said holder to thereby establish a recognized position of said component;

using said recognized position of said component to linearly and/or angularly adjust a position of said component relative to said holder, if necessary;

making a judgement as to whether said holder would make an interference with another component mounted on a substrate were said component held by said holder attempted to be mounted onto said substrate, and (i) when the judgement is affirmative, prohibiting said component held by said holder from being mounted onto said substrate, and (ii) when the judgement is negative, mounting said component held by said holder onto said substrate.

2. The method according to claim 1, wherein making a judgement as to whether said holder would make an interference with another component mounted on a substrate were said component held by said holder attempted to be mounted onto said substrate comprises determining whether a height of said component held by said holder is greater than a height of said another component mounted on said substrate, and when said height of said component held by said holder is determined to be greater than said height of said another component mounted on said substrate, making a judgement that said holder would not make an interference with said another component mounted on said substrate were said component held by said holder attempted to be mounted onto said substrate.

3. The method according to claim 2, wherein prohibiting said component held by said holder from being mounted onto said substrate comprises removing said component from said holder.

4. The method according to claim 1, wherein
making a judgement as to whether said holder would make an interference with another component mounted on a substrate were said component held by said holder attempted to be mounted onto said substrate comprises
(i) defining a reference area for said another component mounted on said substrate,
(ii) assuming that said component held by said holder is correctly positioned relative to said holder, and
(iii) determining whether at least a portion of said holder falls outside said reference area, and
when at least a portion of said holder is determined to fall outside said reference area, making a judgement that said holder would make an interference with said another component mounted on said substrate were said component held by said holder attempted to be mounted onto said substrate.

5. The method according to claim 4, wherein prohibiting said component held by said holder from being mounted onto said substrate comprises removing said component from said holder.

6. The method according to claim 1, wherein
prohibiting said component held by said holder from being mounted onto said substrate comprises removing said component from said holder.

7. A method for mounting a component onto a substrate, comprising:
causing a holder to receive a component from a component supply and hold said component;
making a judgement as to whether said holder would make an interference with another component mounted on a substrate were said component held by said holder to be mounted onto said substrate, and
(i) when the judgement is affirmative, prohibiting said component held by said holder from being mounted onto said substrate, and
(ii) when the judgement is negative, mounting said component held by said holder onto said substrate, wherein
making a judgement as to whether said holder would make an interference with another component mounted on a substrate were said component held by said holder attempted to be mounted onto said substrate comprises
(iii) defining a reference area for said another component mounted on said substrate,
(iv) assuming that said component held by said holder is correctly positioned relative to said holder, and
(v) determining whether at least a portion of said holder falls outside said reference area, and
when at least a portion of said holder is determined to fall outside said reference area, making a judgement that said holder would make an interference with said another component mounted on said substrate were said component held by said holder attempted to be mounted onto said substrate.

8. The method according to claim 7, wherein
prohibiting said component held by said holder from being mounted onto said substrate comprises removing said component from said holder.

* * * * *